United States Patent
Hijikata et al.

(10) Patent No.: US 7,613,440 B2
(45) Date of Patent: Nov. 3, 2009

(54) MIXER CIRCUIT

(75) Inventors: Katsumasa Hijikata, Osaka (JP); Joji Hayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 448 days.

(21) Appl. No.: 10/581,038

(22) PCT Filed: Nov. 15, 2004

(86) PCT No.: PCT/JP2004/016938

§ 371 (c)(1), (2), (4) Date: May 30, 2006

(87) PCT Pub. No.: WO2005/053149

PCT Pub. Date: Jun. 9, 2005

(65) Prior Publication Data

US 2007/0111695 A1    May 17, 2007

(30) Foreign Application Priority Data

Nov. 28, 2003    (JP) .............................. 2003-400262

(51) Int. Cl.
*H04B 1/18*    (2006.01)
*H04B 1/26*    (2006.01)

(52) U.S. Cl. ...................... 455/293; 455/326

(58) Field of Classification Search ................ 455/293, 455/130, 313–316, 323–326, 333, 189.1, 455/205–209, 255–259, 230; 327/11, 355–361
See application file for complete search history.

(56) References Cited

U.S. PATENT DOCUMENTS

| 5,751,033 A | 5/1998 | Miya |
| 5,875,392 A | 2/1999 | Tanaka |
| 5,896,063 A | 4/1999 | Marsh et al. |
| 6,178,320 B1 * | 1/2001 | Richards et al. ............. 455/326 |
| 6,892,061 B2 * | 5/2005 | Asam ........................ 455/313 |

(Continued)

FOREIGN PATENT DOCUMENTS

JP    04-129407    4/1992

(Continued)

OTHER PUBLICATIONS

"RF CMOS Circuit Design Art," Jun. 2002, pp. 8-23, Tricepts Ltd.

*Primary Examiner*—Pablo N Tran
(74) *Attorney, Agent, or Firm*—McDermott Will & Emery LLP

(57) ABSTRACT

A mixer circuit of a receiving system, requiring low noise characteristics at lower frequency, includes a bypass current source (41) which is connected in parallel with an LO transistor (21) between an IF output terminal (33) and a drain terminal of an RF transistor (11), and a bypass current source (42) which is connected in parallel with an LO transistor (22) between an IF output terminal (34) and the drain terminal of the RF transistor (11), thereby decreasing a current flowing through the LO transistors (21, 22) without decreasing a bias current flowing through the RF transistor (11). Accordingly, it is possible to suppress flicker noises occurring from the LO transistors (21, 22) without lowering the gain of the mixer, thereby realizing a mixer circuit with excellent low frequency noise characteristics, which can improve the NF characteristics at lower frequency.

4 Claims, 11 Drawing Sheets

U.S. PATENT DOCUMENTS

| | | | |
|---|---|---|---|
| 7,088,981 B2 * | 8/2006 | Chang | 455/326 |
| 2002/0004376 A1 * | 1/2002 | Lee et al. | 455/326 |
| 2003/0078026 A1 | 4/2003 | Monge | |
| 2003/0216131 A1 * | 11/2003 | Kovacevic et al. | 455/326 |
| 2005/0159130 A1 * | 7/2005 | Yang et al. | 455/326 |
| 2005/0282510 A1 * | 12/2005 | Bang et al. | 455/190.1 |
| 2006/0014509 A1 * | 1/2006 | Xu et al. | 455/255 |
| 2006/0066362 A1 * | 3/2006 | Koutani et al. | 327/103 |
| 2006/0135106 A1 * | 6/2006 | Wu et al. | 455/293 |
| 2007/0004369 A1 * | 1/2007 | Kwon et al. | 455/323 |
| 2008/0113644 A1 * | 5/2008 | Trotta et al. | 455/333 |
| 2008/0254754 A1 * | 10/2008 | Van Waasen et al. | 455/91 |

FOREIGN PATENT DOCUMENTS

| | | |
|---|---|---|
| JP | 4-129407 A | 4/1992 |
| JP | 07-254821 | 10/1995 |
| JP | 7-254821 A | 10/1995 |
| JP | 09-069730 | 3/1997 |
| JP | 9-69730 A | 3/1997 |
| JP | 2001-522566 | 11/2001 |
| JP | 2001-522566 A | 11/2001 |
| JP | 2003-158425 A | 5/2003 |
| JP | 2004-104515 | 4/2004 |
| JP | 2004-104515 A | 4/2004 |

* cited by examiner

MIXER CIRCUIT

RELATED APPLICATION

This application is a national phase of PCT/JP2004/016938 filed on Nov. 15, 2004, which claims priority from Japanese Application No. 2003-400262 filed on Nov. 28, 2003, the disclosures of which Applications are incorporated by reference herein. The benefit of the filing and priority dates of the International and Japanese Applications is respectfully requested.

TECHNICAL FIELD

The present invention relates to a mixer circuit in a receiving system, in particular, in a radio communication apparatus employing such as a direct conversion system or a Low-IF system in which low noise characteristics at low frequencies is required.

BACKGROUND ART

As a receiving system in a radio communication apparatus, there are a super-heterodyne system, a direct conversion system, a Low-IF system, or the like. While the receiving system which is most dominant at present is the super-heterodyne system, the direct conversion system and the Low-IF system have been recently noticed.

FIG. 16 is a block diagram illustrating a common direct conversion receiver.

A direct conversion receiver is one which performs frequency conversion from the RF band to DC without mediating the IF band, and this is operated as follows. A high frequency signal inputted from an antenna 201 is filtered by a band-pass filter (hereinafter, referred to as BPF) 202, and is subjected to signal amplification by a high frequency amplifier (hereinafter, referred to as an LNA) 203, and the resulted high frequency signal is divided into two paths to be inputted to mixers 204a and 204b. A 90° phase shifter 207 produces LO signals having a phase difference of 90° with each other from the signal from the PLL 208, and frequency conversions are carried out in the mixers 204a, 204b using these LO signals. Then, the signals from the mixers 204a, 204b are made pass through the low pass filters 205a, 205b, and they are amplified by VGA 206a, 206b up to desired amplitudes, to be outputted as output signals.

Since the direct conversion system carries out frequency conversion from RF band to DC without mediating IF band using a single mixer, the system construction thereof is simplified. In addition, since there arises no image crosstalk which causes a problem in the super heterodyne system, the number of BPFs can be greatly reduced. Accordingly, it has quite high contributions to cost reduction.

While the direct conversion system is an ideal receiving system as described above, it has following problems.

The problem is that since the frequency base band thereof is DC, it is likely to be affected by flicker noises with relative to the super heterodyne system. In particular, when MOS devices which are generally considered as having flicker noises of 100 to 1000 times with relative to high frequency devices such as bipolar transistors, it may become quite a no little problem (for example, refer to Nonpatent Document 1).

To specifically show this problem, a noise figure of a system in which a LNA 203 and a mixer 204a are connected in cascade connection as shown in FIG. 17 will be described.

When the gain Glna and the noise figure NFlna of the LNA 203 simple are constant as Glna=20 dB and NFlna=5 dB, respectively, and the noise figure NFmix of the mixer 204a simple has flicker noise characteristics which are in inverse proportion to the frequency at low frequency as shown in FIG. 18 (NFmix=15 dB@10 MHz, NFmix=45 dB@1 kHz), the noise figure of the entire system is NFall=5.4 dB at 10 MHz, while NFall=25 dB at 1 kHz from Friis equation. That is, the NFall when the IF signal frequency is high is approximately determined by NFlna, while the NFall when the IF signal frequency is low is approximately decided by NFmix-Glna, strongly depending on NFmix.

Accordingly, in a receiver that employs a direct conversion system or a Low-IF system, the reception sensitivity of the entire system is greatly deteriorated due to the low-frequency noises of the mixer.

The low frequency noise characteristics of the mixer will be described more concretely. Since while there are a single balanced mixer and a double balanced mixer as main stream mixers at present, these may not have large differences in their operations, a description is given of a signal balanced mixer here as one representing the both.

FIG. 19 shows a circuit diagram of a conventional mixer circuit. The basic construction of a mixer core portion thereof is a signal balanced mixer. In addition, numeral 11 denotes an RF transistor, numerals 21 and 22 denote first and second LO (local) transistors, numerals 33 and 34 denote first and second IF output terminals, numerals 31 and 32 denote first and second load resistors, numeral 50 denotes an RF signal supplier, numeral 60 denotes an LO signal supplier, VDD denotes a power supply, and GND denotes the ground.

The RF signal supplier 50 normally comprises an antenna or the like, and it corresponds, for example, to antenna 201, BPF 202, and LNA 203 shown in FIG. 16. The LO signal supplier 60 is normally a PLL or the like, and it corresponds, for example, to PLL 208 and 90° phase shifter 207 shown in FIG. 16.

Initially, the fundamental operation of the mixer circuit will be described.

An RF signal supplied from the RF signal supplier 50 is inputted to the RF transistor 11, and is converted from a voltage signal to a current signal.

On the other hand, differential LO signals which are supplied from the LO signal supplier 60 are inputted to the first and second LO transistors 21 and 22, respectively, and the first and second LO transistors 21 and 22 repeat switching operations at the frequency of the LO signals.

When the RF signal under being converted into a current signal is inputted to the first and second LO transistors 21 and 22 which are performing the switching operation, the RF signal and the LO signal are multiplied. Thereby, the RF signal is subjected to frequency conversion to be an IF signal, and the IF signal is subjected to voltage conversion by the first and second load resistors 31 and 32, thereby voltage IF signals are obtained through the first and second IF output terminals 33 and 34.

Next, the noise characteristics of the conventional mixer circuit will be described.

FIG. 20 shows the noise occupancy ratio of the flicker noises of the first and second LO transistors 21 and 22 in the IF frequency at the first and second IF output terminals 33 and 34. As shown in FIG. 20, more than 70% of the output noises at the frequency of 1 MHz or lower are flicker noises of the first and second LO transistors 21 and 22. Therefore, it is quite effective to suppress the flicker noises of the first and second LO transistors 21 and 22 in order to improve the noise characteristics at low frequency.

Here, the flicker noise occupancy ratio characteristics of the first and second LO transistors 21 and 22 shown in FIG.

20, and graphs of the noise figure characteristics which are shown hereinafter, are all the results of simulations employing the standard SPICE (Simulation Program with Integrated Circuit Emphasis).

Next, the flicker noises of the first and second LO transistors 21 and 22 in the conventional mixer circuit will be described more quantitatively.

First of all, it is known that the noise $Vn^2$ at the gate terminals of the first and second LO transistors 21 and 22 are given by Formula 1.

$$Vn^2 = \frac{kf}{Cox \cdot W \cdot L \cdot f} \quad \text{[Formula 1]}$$

where Cox, W, and L denote gate oxide film capacitance, channel width, and channel length of the first and second LO transistors 21 and 22, respectively, f denotes the frequency, and kf denotes flicker coefficient.

The Vn is converted into a current by a trans-conductance gmLO of the first and second LO transistors 21 and 22, and further is converted into a voltage by the first and second load resistors 31 and 32 to appear at the first and second IF output terminals 33 and 34. Accordingly, output noise $Vno^2$ of the first and second LO transistors 21 and 22 which appear at the first and second IF output terminals 33 and 34, are represented by Formula 2.

$$Vno^2 = \alpha \cdot gmLO^2 \cdot R^2 \cdot \frac{kf}{Cox \cdot W \cdot L \cdot f} \quad \text{[Formula 2]}$$

where R denotes the resistance of the first and second load resistors 31 and 32, and $\alpha$ denotes a constant.

Accordingly, the input conversion noise $Vni^2$ is obtained by dividing the output noise $Vno^2$ by the power gain $\beta \cdot gmRF^2 \cdot R^2$, to be represented by Formula 3.

$$Vni^2 = \frac{\alpha}{\beta} \cdot \frac{gmLO^2}{gmRF_2} \cdot \frac{kf}{Cox \cdot W \cdot L \cdot f} \quad \text{[Formula 3]}$$

where gmRF denotes a trans-conductance of the RF transistor 11, and $\beta$ denotes a constant.

Further, when the input conversion noise $Vni^2$ is expressed by the noise figure NF of a 50Ω system, it is presented by Formula 4.

$$NF = 10 \cdot \log\left(\frac{\gamma}{50 \cdot k \cdot T} \cdot \frac{gmLO^2}{gmRF^2} \cdot \frac{kf}{Cox \cdot W \cdot L \cdot f}\right) \quad \text{[Formula 4]}$$

where k denotes the Boltzmann constant, T denotes an absolute temperature, and $\gamma = \alpha/\beta$.

As conventional techniques, there are following measures as means for improving the NF characteristics at low frequency of the mixer circuit.

The first conventional technique is to increase the transistor sizes of the first and second transistors 21 and 22. The flicker noises are in inverse proportion to the LW products of the first and second LO transistors 21 and 22, as shown by Formula 1. Therefore, by increasing the transistor sizes of the first and second LO transistors 21 and 22, i.e., the LW products, it is possible to improve the NF characteristics according to Formula 4.

The second conventional technique is to increase the gain of the mixer circuit. In order to do so, the trans-conductance gmRF of the RF transistor 11 is to be increased, and this can be realized by increasing the W/L ratio of the RF transistor 11, or by increasing the bias current of the RF transistor 11. Thereby, the input conversion noise can be reduced, and consequently, the NF characteristics be improved according to Formula 4.

The third conventional technique is to optimize the sizes of the first and second load resistors 31 and 32. When the output noises at low frequency are dominated by flicker noises and resistor thermal noises of the first and second load resistors 31 and 32, the ratio between the resistor thermal noises and the flicker noises can be optimized by adjusting the sizes of the first and second load resistors 31 and 32, thereby improving the NF characteristics at low frequency (for example, refer to Patent Document 1).

Patent Document 1: Japanese Published Patent Application No. 2003-158425 (Pages 1-6, FIG. 1)

Non-patent Document 1: Nobuyuki Ito, "RF CMOS circuit design technique", Triceps Corporation, June, 2002, Pages 6-23

However, the above-described methods of improving the low frequency noise characteristics in the mixer circuit have following problems, respectively.

In the first conventional technique, if the LW product is increased, the first and second LO transistors 21 and 22 cannot perform complete switching operations, and thereby the gain is reduced. Further, since the parasitic capacitances of the first and second LO transistors 21 and 22 are increased, the respective frequency characteristics of the RF and LO signals are deteriorated. Therefore, it is not possible to take a so large value for the LW product.

In the second conventional technique, if the W/L ratio of the RF transistor 11 is increased, the distortion characteristics or the frequency characteristics of the RF signal are deteriorated. Therefore, it is not possible to take a so large value for the W/L ratio.

Further, since, as for the bias current, a half of the bias current of the RF transistor becomes the bias currents of the first and second LO transistors 21 and 22, respectively, as is apparent from the circuit construction in FIG. 19, even if gmRF is increased by increasing the bias current, gmLO also increases in proportion thereto, and as a result, it is not possible to obtain a small value for NF.

Though the third conventional technique is effective to some extent when employing a high frequency device such as a bipolar that is superior in the low frequency noise characteristics, it is not so effective when employing MOS devices because the proportion of the flicker noises of the first and second LO transistors 21 and 22 are large. Further, the sizes of the first and second load resistors 31 and 32 are required to be made quite large, and thereby there also arise problems in the circuit area, in the frequency characteristics of the IF signal, and the like.

As described above, the conventional mixer circuits do not have effective measures to reduce the low frequency noises, and particularly, it was not possible to obtain an improved reception sensitivity in a receiving system employing a direct conversion system or a Low-IF system.

The present invention is directed to solving the above described problems, and has for its object to provide a mixer circuit which is superior in the low frequency noise characteristics.

MEASURES TO SOLVE THE PROBLEMS

In order to solve the problems, there is provided a mixer circuit according to claim 1 of the present invention which comprises: a mixer including an IF signal output load portion, an LO signal processing portion, and an RF signal processing portion, which are connected in cascade connection between a power supply and a ground; an RF signal supplier for supplying an RF signal to the RF signal processing portion; an LO signal supplier for supplying an LO signal to the LO signal processing portion; and at least a bypass current supply portion for bypassing a bias current of the LO signal processing portion.

According to claim 2 of the present invention, there is provided a mixer circuit as defined in claim 1, where the bypass current supply portion is connected in parallel with the LO signal processing portion.

According to claim 3 of the present invention, there is provided a mixer circuit as defined in claim 1, where the bypass current supply portion additionally supplies a bias current only to the RF signal processing portion.

According to claim 4 of the present invention, there is provided a mixer circuit as defined in claim 1, where the bypass current supply portion includes a first bypass current source for additionally supplying a bias current only to the RF signal processing portion, and a second bypass current source for additionally supplying a bias current only to the IF signal output load portion.

According to claim 5 of the present invention, there is provided a mixer circuit which comprises: a single balanced mixer including an IF signal output load portion, an LO signal processing portion, and an RF signal processing portion, which are connected in cascade connection between a supply voltage and a ground; an RF signal supplier for supplying an RF signal to the RF signal processing portion; an LO signal supplier for supplying an LO signal to the LO signal processing portion; at least one bypass current supply portion for bypassing a bias current of the LO signal processing portion; and said IF signal output load portion including a first load resistor having an end connected to the power supply and another end connected to a first IF output terminal, and a second load resistor having an end connected to the power supply and another end connected to a second IF output terminal; the RF signal processing portion including an RF transistor having a source terminal connected to the ground; said LO signal processing portion including a first LO transistor having a source terminal connected to a drain terminal of the RF transistor and a drain terminal connected to the first IF output terminal, and a second LO transistor having a source terminal connected to the drain terminal of the RF transistor and a drain terminal connected to the second IF output terminal.

According to claim 6 of the present invention, there is provided a mixer circuit as defined in claim 5, where the bypass current supply portion includes a first bypass current source which is connected in parallel with the first LO transistor between the first IF output terminal and the drain terminal of the RF transistor, and a second bypass current source which is connected in parallel with the second LO transistor between the second IF output terminal and the drain terminal of the RF transistor.

According to claim 7, there is provided a mixer circuit as defined in claim 5, where the bypass current supply portion includes a first bypass current source for additionally supplying a bias current only to the RF transistor, which is connected between the power supply and the drain terminal of the RF transistor.

According to claim 8 of the present invention, there is provided a mixer circuit as defined in claim 5, where the bypass current supply portion includes a first bypass current source for additionally supplying a bias current only to the RF transistor, which is connected between the supply voltage and the drain terminal of the RF transistor, a second bypass current source for additionally supplying a bias current only to the first load resistor, which is connected between the first IF output terminal and the ground, and a third bypass current source for additionally supplying a bias current only to the second load resistor, which is connected between the second IF output terminal and the ground.

According to claim 9 of the present invention, there is provided a mixer circuit comprising: a double balanced mixer including an IF signal output load portion, an LO signal processing portion, and an RF signal processing portion, which are connected in cascade connection between a power supply and a ground; an RF signal supplier for supplying an RF signal to the RF signal processing portion; an LO signal supplier for supplying an LO signal to the LO signal processing portion; at least one bypass current supply portion for bypassing a bias current of the LO signal processing portion; and the IF signal output load portion including a first load resistor having an end connected to the power supply and another end connected to a first IF output terminal, and a second load resistor having an end connected to the power supply and another end connected to a second IF output terminal; the RF signal processing portion including a first RF transistor and a second RF transistor each having a source terminal connected to the ground; and the LO signal processing portion including a first LO transistor having a source terminal connected to a drain terminal of the first RF transistor and a drain terminal connected to the first IF output terminal, a second LO transistor having a source terminal connected to the drain terminal of the first RF transistor and a drain terminal connected to the second IF output terminal, a third LO transistor having a source terminal connected to a drain terminal of the second RF transistor and a drain terminal connected to the first IF output terminal, and a fourth LO transistor having a source terminal is connected to the drain terminal of the second RF transistor and a drain terminal connected to the second IF output terminal.

According to claim 10 of the present invention, there is provided a mixer circuit as defined in claim 9, where the bypass current supply portion includes a first bypass current source which is connected in parallel with the first LO transistor between the first IF output terminal and the drain terminal of the first RF transistor, a second bypass current source which is connected in parallel with the second LO transistor between the second IF output terminal and the drain terminal of the first RF transistor, a third bypass current source which is connected in parallel with the third LO transistor between the first IF output terminal and the drain terminal of the second RF transistor, and a fourth bypass current source which is connected in parallel with the fourth LO transistor between the second IF output terminal and the drain terminal of the second RF transistor.

According to claim 11 of the present invention, there is provided a mixer circuit as defined in claim 9, where the bypass current supply portion includes a first bypass current source which is connected in parallel with the first LO transistor between the first IF output terminal and the drain terminal of the first RF transistor, and a second bypass current source which is connected in parallel with the fourth LO transistor between the second IF output terminal and the drain terminal of the second RF transistor.

According to claim 12 of the present invention, there is provided a mixer circuit as defined in claim 9, the bypass current supply portion includes a first bypass current source for additionally supplying a bias current only to the first RF transistor, which is connected between the power supply and the drain terminal of the first RF transistor, and a second bypass current source for additionally supplying a bias current only to the second RF transistor, which is connected between the supply voltage and the drain terminal of the second RF transistor.

According to claim 13 of the present invention, there is provided a mixer circuit as defined in claim 9, where the bypass current supply portion includes a first bypass current source for additionally supplying a bias current only to the first RF transistor, which is connected between the power supply and the drain terminal of the first RF transistor, a second bypass current source for additionally supplying a bias current only to the second RF transistor, which is connected between the supply voltage and the drain terminal of the second RF transistor, a third bypass current source for additionally supplying a bias current only to the first load resistor, which is connected between the first IF output terminal and the ground, and a fourth bypass current source for additionally supplying a bias current only to the second load resistor, which is connected between the second IF output terminal and the ground.

According to claim 14 of the present invention, there is provided a mixer circuit as defined in any of claims 1, 5, and 9, where the first to fourth bypass current sources include a bias circuit having a bias voltage output terminal, and a current source transistor having a gate terminal connected to the bias voltage output terminal.

According to claim 15 of the present invention, there is provided a mixer circuit as defined in any of claims 1, 5, and 9, the mixer, the single balanced mixer, and the double balanced mixer are respectively constituted by an MOS transistor.

According to claim 16 of the present invention, there is provided a mixer circuit as defined in any of claims 1, 5, and 9, where the mixer circuit is one which is employed in a receiving system according to a direct conversion system, or a receiving system according to a Low-IF system.

EFFECTS OF THE INVENTION

According to the mixer circuit of claim 1, since the mixer circuit includes a mixer including an IF signal output load portion, an LO signal processing portion, and an RF signal processing portion, which are connected in cascade connection between a power supply and a ground; an RF signal supplier for supplying an RF signal to the RF signal processing portion; an LO signal supplier for supplying an LO signal to the LO signal processing portion; and at least a bypass current supply portion for bypassing a bias current of the LO signal processing portion, it is possible to reduce flicker noises occurring from the LO signal processing portion without reducing the gain of the mixer, thereby improving noise characteristics at lower frequency.

According to the mixer circuit of claim 2, since in the mixer circuit of claim 1, the bypass current supply portion is connected in parallel with the LO signal processing portion, it is possible to reduce the bias current of the LO signal processing portion without reducing the bias current of the RF signal processing portion, thereby reducing the NF.

According to the mixer circuit of claim 3, since in the mixer circuit of claim 1, the bypass current supply portion additionally supplies a bias current only to the RF signal processing portion, it is possible to reduce the bias current of the LO signal processing portion without reducing the bias current of the RF signal processing portion, thereby reducing the NF.

According to the mixer circuit of claim 4, since in the mixer circuit of claim 1, the bypass current supply portion includes a first bypass current source for additionally supplying a bias current only to the RF signal processing portion, and a second bypass current source for additionally supplying a bias current only to the IF signal output load portion, it is possible to reduce the bias current of the LO signal processing portion without reducing the bias current of the RF signal processing portion, thereby reducing the NF.

According to the mixer circuit of claim 5, since the mixer circuit includes a single balanced mixer including an IF signal output load portion, an LO signal processing portion, and an RF signal processing portion, which are connected in cascade connection between a supply voltage and a ground; an RF signal supplier for supplying an RF signal to the RF signal processing portion; an LO signal supplier for supplying an LO signal to the LO signal processing portion; at least one bypass current supply portion for bypassing a bias current of the LO signal processing portion; and said IF signal output load portion including a first load resistor having an end connected to the power supply and another end connected to a first IF output terminal, and a second load resistor having an end connected to the power supply and another end connected to a second IF output terminal; the RF signal processing portion including an RF transistor having a source terminal connected to the ground; said LO signal processing portion including a first LO transistor having a source terminal connected to a drain terminal of the RF transistor and a drain terminal connected to the first IF output terminal, and a second LO transistor having a source terminal connected to the drain terminal of the RF transistor and a drain terminal connected to the second IF output terminal, it is possible to reduce flicker noises occurring from the LO signal processing portion without reducing the gain of the mixer, thereby improving noise characteristics at lower frequencies.

According to the mixer circuit of claim 6, since in the mixer circuit of claim 5, the bypass current supply portion includes a first bypass current source which is connected in parallel with the first LO transistor between the first IF output terminal and the drain terminal of the RF transistor, and a second bypass current source which is connected in parallel with the second LO transistor between the second IF output terminal and the drain terminal of the RF transistor, it is possible to reduce the bias current of the LO signal processing portion without reducing the bias current of the RF signal processing portion, thereby reducing NF.

According to the mixer circuit of claim 7, since in the mixer circuit of claim 5, the bypass current supply portion includes a first bypass current source for additionally supplying a bias current only to the RF transistor, which is connected between the power supply and the drain terminal of the RF transistor, it is possible to reduce the bias current of the LO signal processing portion without reducing the bias current of the RF signal processing portion, thereby reducing the NF.

According to the mixer circuit of claim 8, since in the mixer circuit of claim 5, the bypass current supply portion includes a first bypass current source for additionally supplying a bias current only to the RF transistor, which is connected between the supply voltage and the drain terminal of the RF transistor, a second bypass current source for additionally supplying a bias current only to the first load resistor, which is connected between the first IF output terminal and the ground, and a third bypass current source for additionally supplying a bias current only to the second load resistor, which is connected between the second IF output terminal and the ground, it is possible to reduce the bias current of the LO signal processing portion without reducing the bias current of the RF signal processing portion, thereby reducing the NF.

According to claim 9 of the present invention, since the mixer circuit includes a double balanced mixer including an IF signal output load portion, an LO signal processing portion, and an RF signal processing portion, which are connected in cascade connection between a power supply and a ground; an RF signal supplier for supplying an RF signal to the RF signal processing portion; an LO signal supplier for supplying an LO signal to the LO signal processing portion; at least one bypass current supply portion for bypassing a bias current of the LO signal processing portion; and the IF signal output load portion including a first load resistor having an end connected to the power supply and another end connected to a first IF output terminal, and a second load resistor having an end connected to the power supply and another end connected to a second IF output terminal; the RF signal processing portion including a first RF transistor and a second RF transistor each having a source terminal connected to the ground; and the LO signal processing portion including a first LO transistor having a source terminal connected to a drain terminal of the first RF transistor and a drain terminal connected to the first IF output terminal, a second LO transistor having a source terminal connected to the drain terminal of the first RF transistor and a drain terminal connected to the second IF output terminal, a third LO transistor having a source terminal connected to a drain terminal of the second RF transistor and a drain terminal connected to the first IF output terminal, and a fourth LO transistor having a source terminal is connected to the drain terminal of the second RF transistor and a drain terminal connected to the second IF output terminal, it is possible to reduce flicker noises occurring from the LO signal processing portion without reducing the gain of the mixer, thereby improving noise characteristics at lower frequencies.

According to the mixer circuit of claim 10, since in the mixer circuit of claim 9, the bypass current supply portion includes a first bypass current source which is connected in parallel with the first LO transistor between the first IF output terminal and the drain terminal of the first RF transistor, a second bypass current source which is connected in parallel with the second LO transistor between the second IF output terminal and the drain terminal of the first RF transistor, a third bypass current source which is connected in parallel with the third LO transistor between the first IF output terminal and the drain terminal of the second RF transistor, and a fourth bypass current source which is connected in parallel with the fourth LO transistor between the second IF output terminal and the drain terminal of the second RF transistor, it is possible to reduce the bias current of the LO signal processing portion without reducing the bias current of the RF signal processing portion, thereby reducing the NF.

According to claim 11, in the mixer circuit as defined in claim 9, the bypass current supply portion includes: a first bypass current source which is connected in parallel with the first LO transistor, between the first IF output terminal and the drain terminal of the first RF transistor; and a second bypass current source which is connected in parallel with the fourth LO transistor, between the second IF output terminal and the drain terminal of the second RF transistor. Therefore, it is possible to reduce the bias current of the LO signal processing portion without reducing the bias current of the RF signal processing portion, and thereby consequently reducing the NF.

According to the mixer circuit of claim 12, since in the mixer circuit of claim 9, the bypass current supply portion includes a first bypass current source for additionally supplying a bias current only to the first RF transistor, which is connected between the power supply and the drain terminal of the first RF transistor, and a second bypass current source for additionally supplying a bias current only to the second RF transistor, which is connected between the supply voltage and the drain terminal of the second RF transistor, it is possible to reduce the bias current of the LO signal processing portion without reducing the bias current of the RF signal processing portion, thereby reducing the NF.

According to the mixer circuit of claim 13, since in the mixer circuit of claim 9, the bypass current supply portion includes a first bypass current source for additionally supplying a bias current only to the first RF transistor, which is connected between the power supply and the drain terminal of the first RF transistor, a second bypass current source for additionally supplying a bias current only to the second RF transistor, which is connected between the supply voltage and the drain terminal of the second RF transistor, a third bypass current source for additionally supplying a bias current only to the first load resistor, which is connected between the first IF output terminal and the ground, and a fourth bypass current source for additionally supplying a bias current only to the second load resistor, which is connected between the second IF output terminal and the ground, it is possible to reduce the bias current of the LO signal processing portion without reducing the bias current of the RF signal processing portion, thereby reducing the NF.

According to the mixer circuit of claim 14, since in the mixer circuit of any of claims 1, 5, and 9, the first to fourth bypass current sources include a bias circuit having a bias voltage output terminal, and a current source transistor having a gate terminal connected to the bias voltage output terminal, it is possible to generate a bias current.

According to the mixer circuit of claim 15, since in the mixer circuit of any of claims 1, 5, and 9, the mixer, the single balanced mixer, and the double balanced mixer are respectively constituted by an MOS transistor, a mixer circuit having good low frequency noise characteristics can be obtained by using MOS transistors.

According to the mixer circuit of claim 16, since in the mixer circuit of any of claims 1, 5, and 9, the mixer circuit is one which is employed in a receiving system according to a direct conversion system, or a receiving system according to a Low-IF system, it is possible to obtain a receiver system according to the direct conversion system or a receiver system according to the Low-IF system that has preferable low frequency noise characteristics.

Figure 1:
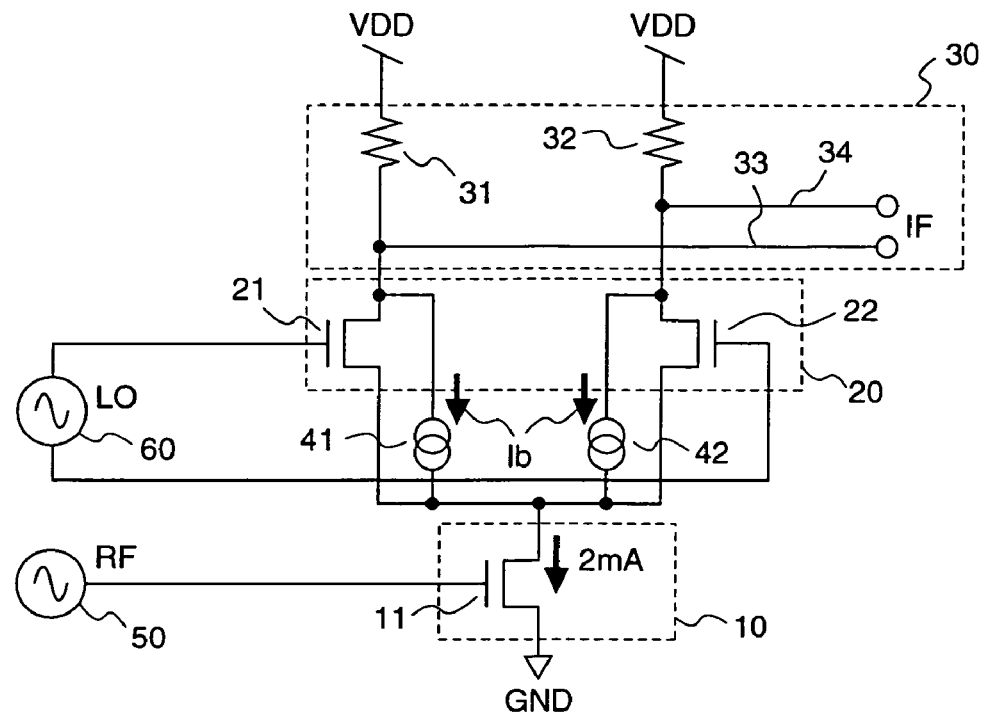
FIG. 1 is a circuit diagram showing a structure of a mixer circuit according to a first embodiment of the present invention.

DESCRIPTION OF REFERENCE NUMERALS 10, 110 . . . RF signal processing portion
11, 111, 112 . . . RF transistor
20, 120 . . . LO signal processing portion
21, 121 . . . first LO transistor
22, 122 . . . second LO transistor
123 . . . third LO transistor
124 . . . fourth LO transistor
30, 130 . . . IF signal output load portion
31, 131 . . . first load resistor
32, 132 . . . second load resistor
33, 133 . . . first IF output terminal
34, 134 . . . second IF output terminal
41, 45, 141, 145 . . . first bypass current source
42, 46, 142, 146 . . . second bypass current source
47, 143, 147 . . . third bypass current source
144, 148 . . . fourth bypass current source
43 . . . bias circuit
44 . . . current source transistor
50, 150 . . . RF signal supplier
60, 160 . . . LO signal supplier
VDD . . . supply voltage
GND . . . ground
201 . . . antenna
202 . . . BPF
203 . . . LNA
204a, 204b . . . mixer
205a, 205b . . . LPF
206a, 206b . . . VGA
207 . . . 90° phase shifter
208 . . . PLL
209 . . . I output terminal
210 . . . Q output terminal
211 . . . RF signal input terminal
212 . . . IF signal output terminal

BEST MODE FOR EMBODIYING THE INVENTION

Hereinafter, embodiments of the present invention will be described with reference to the drawings.

Embodiment 1

FIG. 1 is a circuit diagram illustrating a structure of a mixer circuit according to a first embodiment of the present invention.

As shown in FIG. 1, the mixer circuit according to the first embodiment has a basic structure of its mixer core part which is constituted by a single balanced mixer, and includes a single balanced mixer which is obtained by connecting an IF signal output load portion 30, an LO signal processing portion 20, and an RF signal processing portion 10 in cascade connection between a power supply VDD and a ground GND, an RF signal supplier 50 for supplying an RF signal to the RF signal processing portion 10, an LO signal supplier 60 for supplying LO signals to the LO signal processing portion 20, and first and second bypass current sources 41 and 42 which make bypass currents bypass the LO signal processing portion 20 with being connected in parallel with the LO signal processing portion 20.

The IF signal output load portion 30 includes a first load resistor 31 having an end which is connected to the supply voltage VDD and another end which is connected to a first IF output terminal 33, and a second load resistor 32 having an end which is connected to the supply voltage VDD and another end which is connected to a second IF output terminal 34.

The RF signal processing portion 10 comprises an RF transistor 11 having a source terminal which is connected to the ground GND.

The LO signal processing portion 20 includes a first LO transistor 21 having a source terminal which is connected to a drain terminal of the RF transistor 11 and a drain terminal which is connected to the first IF output terminal 33, and a second LO transistor 22 having a source terminal which is connected to the drain terminal of the RF transistor 11 and a drain terminal which is connected to the second IF output terminal 34.

Figure 2:
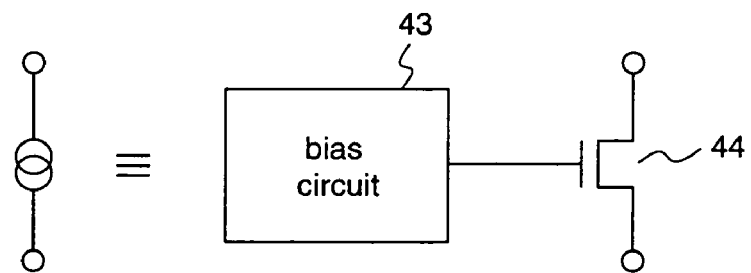
FIG. 2 is a circuit diagram showing a structure of a bypass current source.

The first bypass current source 41 is connected in parallel with the first LO transistor 21 between the first IF output terminal 33 and the drain terminal of the RF transistor 11, and the second bypass current source 42 is connected in parallel with the second LO transistor 22 between the second IF output terminal 34 and the drain terminal of the RF transistor 11. These first and second bypass current sources 41 and 42 may be, for example, one including the bias circuit 43 and the current source transistor 44 as shown in FIG. 2. The first and second bypass current sources 41 and 42 are included in a bypass current supply portion described in claim 6.

Besides, the first embodiment may not limit the construction of the first and second bypass current sources 41 and 42, but may generate bypass currents by any elements or circuits which realize constant current source characteristics.

The operation of the mixer circuit according to the first embodiment in which the basic structure of the mixer core part is constituted by a single balanced mixer as described above, will be described hereinafter.

An RF signal that is supplied from the RF signal supplier 50 is inputted to the RF transistor 11, and is converted from a voltage signal into a current signal.

On the other hand, differential LO signals which are supplied from the LO signal supplier 60 are inputted to the first and second LO transistors 21 and 22, respectively, and the first and second LO transistors 21 and 22 repeatedly perform a switching operation at the frequency of the LO signal.

When the RF signal that has been converted into the current signal is inputted to these first and second LO transistors 21 and 22 performing the switching operation, the RF signal and the LO signal are multiplied. Thus, the RF signal is subjected to frequency conversion to be an IF signal, and this IF signal is subjected to voltage conversion by the first and second load resistors 31 and 32, thereby outputting voltage IF signals through the first and second IF output terminals 33 and 34.

At this time, the first bypass current source 41 decreases a bias current flowing through the first LO transistor 21 thereby to suppress flicker noises occurring from the first LO transistor 21. Similarly, the second bypass current source 42 decreases a bias current flowing through the second LO transistor 22 thereby to suppress the flicker noises occurring from the second LO transistor 22.

Next, the effects of suppressing flicker noises by the mixer circuit according to the first embodiment will be described, compared with the conventional mixer circuit.

Figure 3:
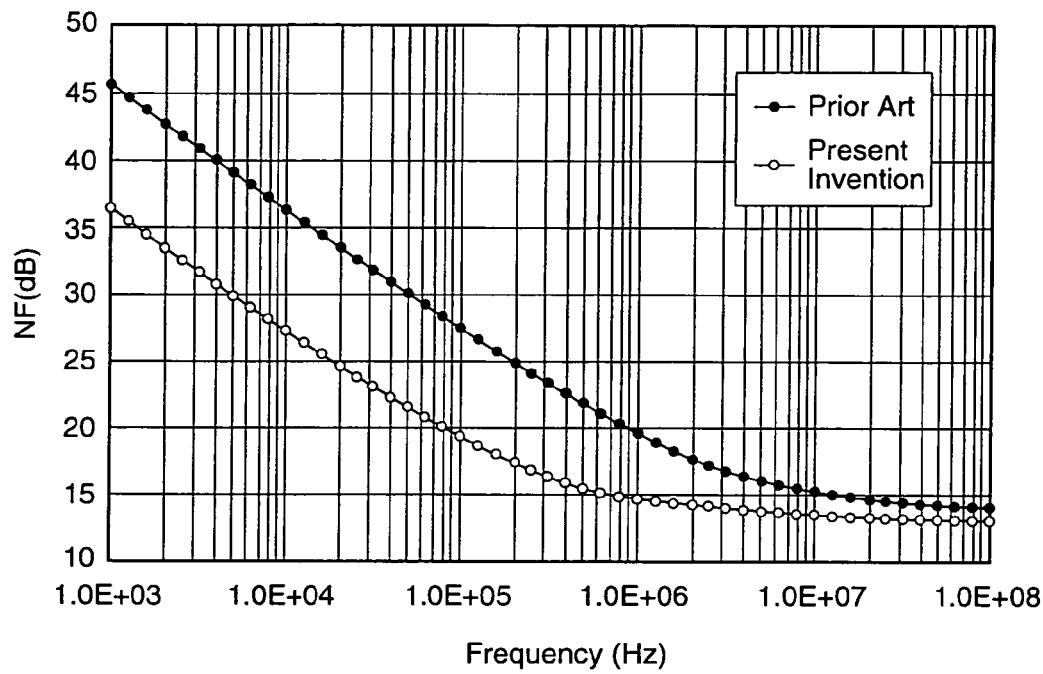
FIG. 3 is a characteristics chart illustrating effects of the mixer circuit according to the first embodiment.

FIG. 3 is an NF characteristics chart for explaining the effects of the mixer circuit according to the first embodiment. This chart shows plotted NF characteristics on the first and second IF output terminals 33 and 34 in a case where a bias current of 2 mA is supplied to the RF transistor 11, an LO signal with a frequency of 1 GHz and an amplitude of 1V is supplied from the LO signal supplier 60, and the first and second bypass current sources 41 and 42 have a current value of Ib=1 mA, respectively. For comparison with the conventional mixer circuit, the NF characteristics when the first and second bypass current sources 41 and 42 are not provided is also shown.

In the conventional mixer circuit which includes no bypass current sources, the half of the bias current flowing through the RF transistor 11 is supplied to the first and second LO transistors 21 and 22 as bias currents of the LO transistor, respectively. In contrast, in the mixer circuit of the first embodiment, the first and second bypass current sources 41 and 42 are connected to the first and second LO transistors 21 and 22, respectively, as shown in FIG. 1, and thereby, it is possible to decrease the bias current flowing through the first and second LO transistors 21 and 22 without decreasing the bias current flowing through the RF transistor 11. That is, it is possible to decrease gmLO without decreasing gmRF of Formula 4, thereby to improve the NF characteristics. For example, it is possible to increase NF at 1 kHz, by about 10 dB, as compared with the conventional mixer circuit, as shown in FIG. 3.

As described above, in the mixer circuit according to the first embodiment, since the first bypass current source 41 is connected in parallel with the first LO transistor 21, and the second bypass current source 42 is connected in parallel with the second LO transistor 22, it is possible to decrease the bias current flowing through the first and second LO transistors 21 and 22 without decreasing the bias current flowing through the RF transistor 11, and to improve the NF characteristics at low frequencies.

While in the first embodiment the basic construction of the mixer core part is a single balanced mixer, the present invention does not limit the basic construction of the mixer core part, and a dual gate mixer or the like may be employed.

Further, while in the first embodiment the single balanced mixer is constituted by MOS transistors, it is not limited to that, and a construction in which bipolar transistors, MESFETs of GaAs, or the like, are used may be employed.

Embodiment 2

Figure 4:
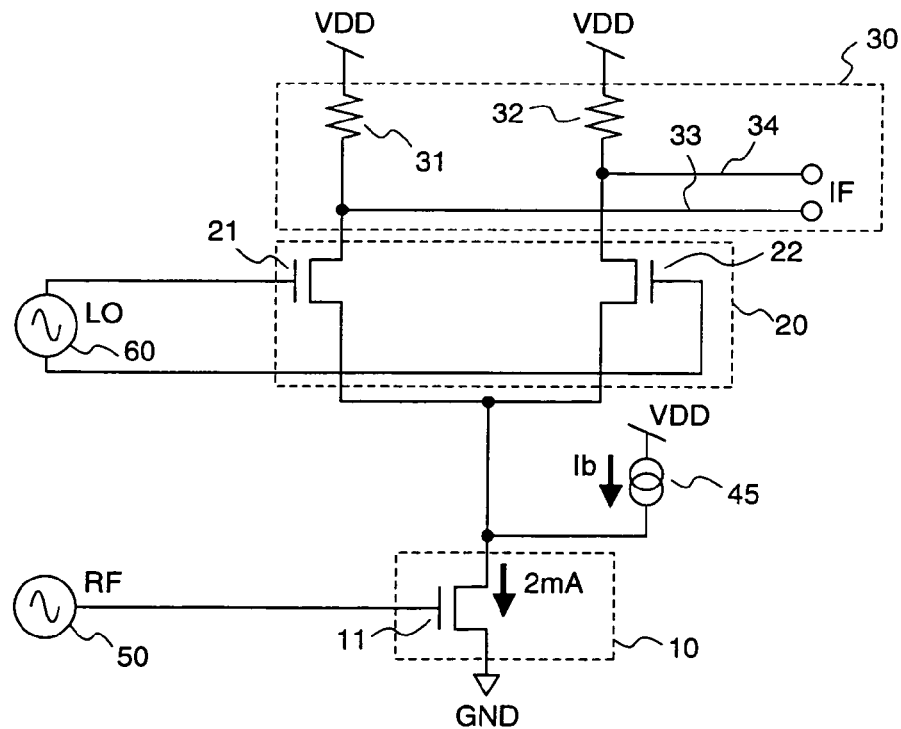
FIG. 4 is a circuit diagram showing a structure of a mixer circuit according to a second embodiment of the present invention.

FIG. 4 is a circuit diagram illustrating a construction of a mixer circuit according to a second embodiment of the present invention. In FIG. 4, the same or corresponding parts as in FIG. 1 are denoted by the same reference numerals, and their detailed descriptions are omitted.

As shown in FIG. 4, in the mixer circuit according to the second embodiment, a first bypass current source 45 is connected between the power supply VDD and the drain terminal of the RF transistor 11, so as to additionally supply a bias current only to the RF transistor 11. The first bypass current source 45 is covered by a bypass current supply portion described in claim 7.

The first bypass current source 45 may be, for example, one which includes the bias circuit 43 and the current source transistor 44, as shown in FIG. 2. Further, it may generate bypass currents by any elements or circuits which realize constant current source characteristics.

The operation of the mixer circuit according to the second embodiment in which the basic construction of the mixer core part is constituted by a single balanced mixer as described above, will be described hereinafter.

An RF signal that is supplied from the RF signal supplier 50 is inputted to the RF transistor 11, and is converted from a voltage signal into a current signal.

On the other hand, differential LO signals that are supplied from the LO signal supplier 60 are inputted to the first and second LO transistors 21 and 22, respectively, and the first and second LO transistors 21 and 22 repeatedly perform a switching operation at the frequency of the LO signal.

When the RF signal that has been converted into the current signal is inputted to the first and second LO transistors 21 and 22 performing the switching operation, the RF signal and the LO signal are multiplied. Thus, the RF signal is subjected to frequency conversion to be an IF signal, and this IF signal is subjected to voltage conversion by the first and second load resistors 31 and 32, thereby outputting voltage IF signals through the first and second IF output terminals 33 and 34.

At this time, the bypass current source 45 decreases the bias current flowing through the first and second LO transistors 21 and 22, thereby to suppress flicker noises occurring from the first and second LO transistors 21 and 22.

Next, the effects of suppressing flicker noises by the mixer circuit according to the second embodiment will be described, compared with the conventional mixer circuit.

Figure 5:
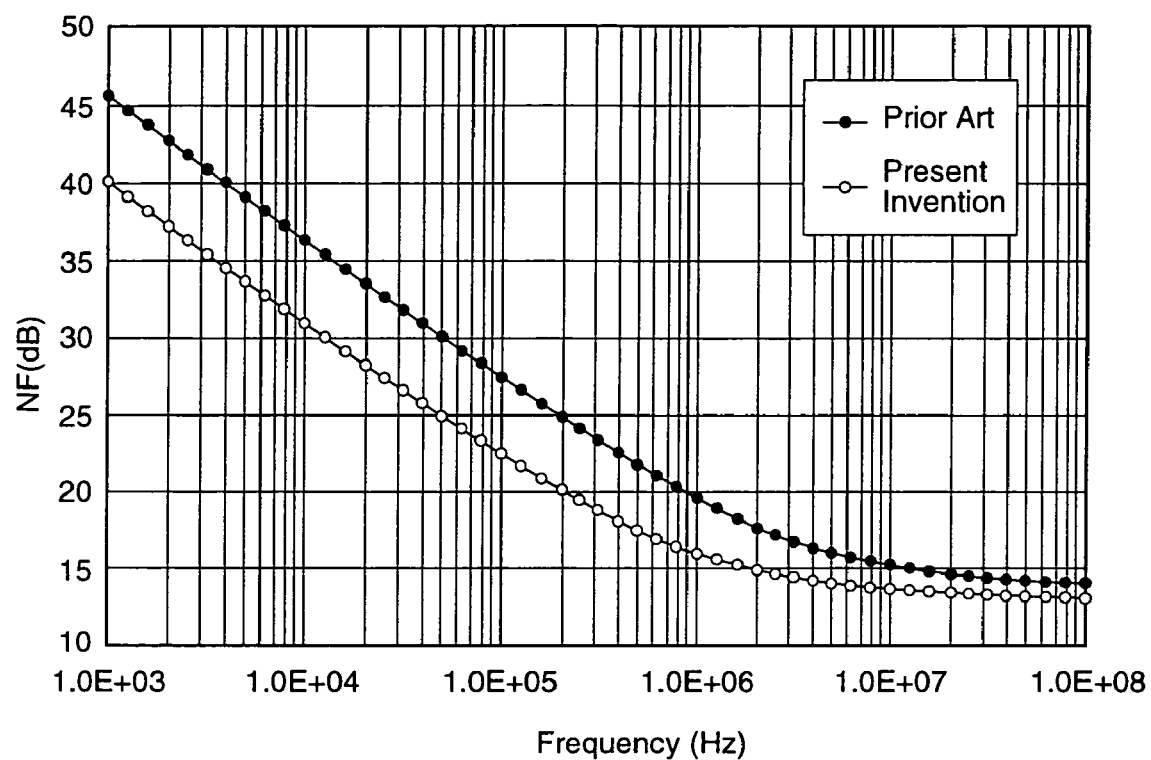
FIG. 5 is a characteristics chart illustrating effects of the mixer circuit according to the second embodiment.

FIG. 5 is an NF characteristics chart for explaining the effects of the mixer circuit according to the second embodiment. This chart shows plotted NF characteristics on the first and second IF output terminals 33 and 34 in a case where a bias current of 2 mA is supplied to the RF transistor 11, LO signals with a frequency of 1 GHz and an amplitude of 1V are supplied from the LO signal supplier 60, and the first bypass current source 45 has a current value of Ib=2 mA. For comparison with the conventional mixer circuit, the NF characteristics when the first bypass current source 45 is not provided is also shown.

In the conventional mixer circuit which includes no bypass current sources, the half of the bias current flowing through the RF transistor 11 is supplied to the first and second LO transistors 21 and 22 as bias currents of the LO transistor, respectively. In contrast, in the mixer circuit according to the second embodiment, the first bypass current source 45 is connected between the power supply VDD and the RF transistor 11 as shown in FIG. 4, and thereby, it is possible to decrease the bias currents flowing through the first and second LO transistors 21 and 22 without decreasing the bias current flowing through the RF transistor 11. That is, it is possible to decrease gmLO without decreasing gmRF of Formula 4, thereby to improve the NF characteristics. For example, it is possible to increase the NF at 1 kHz, by about 5 dB, as compared with the conventional mixer circuit, as shown in FIG. 5.

As described above, in the mixer circuit according to the second embodiment, since the first bypass current source 45 is connected between the power supply VDD and the drain terminal of the RF transistor 11 so as to additionally supply the bias current only to the RF transistor 11, it is possible to decrease the bias current flowing through the first and second LO transistors 21 and 22 without decreasing the bias current flowing through the RF transistor 11, and thereby to improve the NF characteristics at lower frequencies.

While in the second embodiment the basic construction of the mixer core part is a single balanced mixer, the present invention does not limit the basic construction of the mixer core part, and a dual gate mixer or the like may employed.

Further, while in the second embodiment the single balanced mixer is constituted by MOS transistors, it is not limited to that, and a construction in which bipolar transistors, MESFETs of GaAs, or the like are used may be employed.

Embodiment 3

Figure 6:
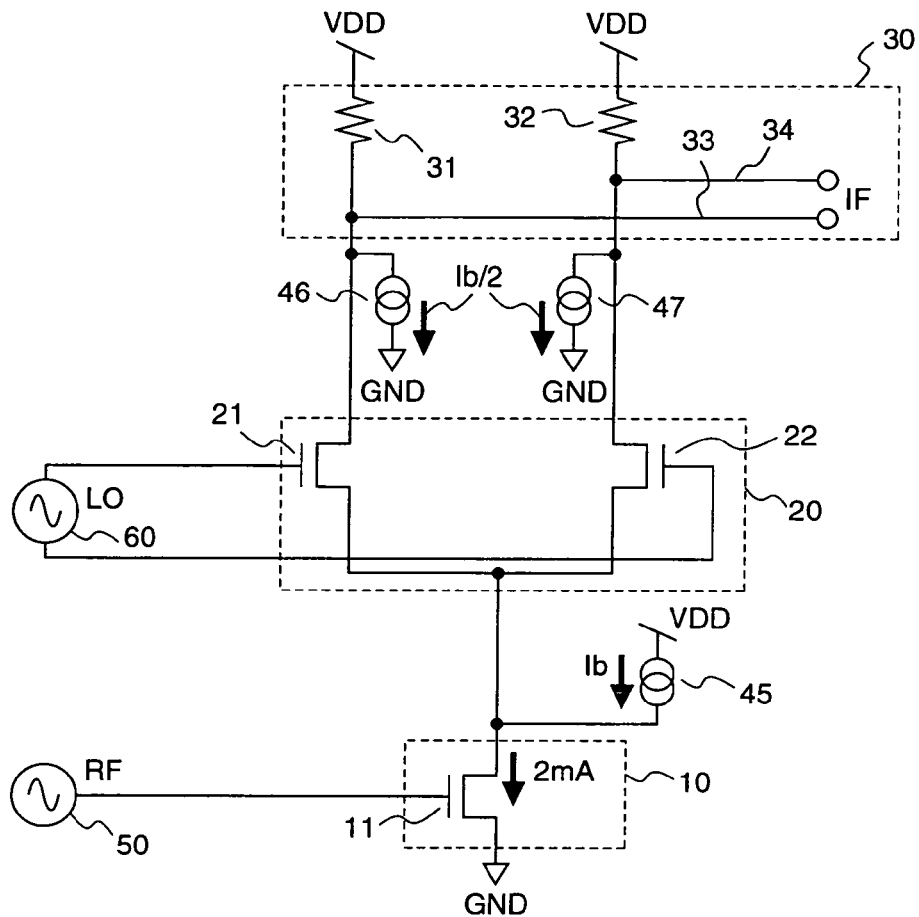
FIG. 6 is a circuit diagram showing a structure of a mixer circuit according to a third embodiment of the present invention.

FIG. 6 is a circuit diagram illustrating a structure of a mixer circuit according to a third embodiment of the present invention. In FIG. 6, the same or corresponding parts as in FIG. 4 are denoted by the same reference numerals, and their detailed descriptions are omitted.

As shown in FIG. 6, the mixer circuit according to the third embodiment includes, in addition to that the mixer circuit of the second embodiment of the present invention is provided with the first bypass current source 45 that additionally supplies the bias current only to the RF transistor 11, further a second bypass current source 46 that is connected between the first IF output terminal 33 and the ground GND thereby to additionally supply a bias current only to the first load resistor 31, and a third bypass current source 47 that is connected between the second IF output terminal 34 and the ground GND thereby to additionally supply a bias current only to the second load resistor 32. The first to third bypass current sources 45 to 47 are covered by a bypass current supply portion described in claim 8.

The second and third bypass current sources 46 and 47 may be, for example, those which include the bias circuit 43 and the current source transistor 44, as shown in FIG. 2. Further, bypass currents may be generated by any elements or circuits which realize constant current source characteristics.

The operation of the mixer circuit according to the third embodiment in which the basic construction of the mixer core part is constituted by a single balanced mixer as described above, will be described hereinafter.

An RF signal that is supplied from the RF signal supplier 50 is inputted to the RF transistor 11, and is converted from a voltage signal into a current signal.

On the other hand, differential LO signals that are supplied from the LO signal supplier 60 are inputted to the first and second LO transistors 21 and 22, respectively, and the first and second LO transistors 21 and 22 repeatedly perform switching operations at the frequency of the LO signal.

When the RF signal that has been converted into the current signal is inputted to the first and second LO transistors 21 and 22 performing the switching operation, the RF signal and the LO signal are multiplied. Thus, the RF signal is subjected to frequency conversion to be an IF signal, and this IF signal is subjected to voltage conversion by the first and second load resistors 31 and 32, thereby outputting voltage IF signals through the first and second IF output terminals 33 and 34.

At this time, the first bypass current source 45 and the second and third bypass current sources 46 and 47 decrease the bias current flowing through the first and second LO transistors 21 and 22, and suppress flicker noises occurring from the first and second LO transistors 21 and 22.

Next, the effects of suppressing flicker noises by the mixer circuit according to the third embodiment will be described, compared with the conventional mixer circuit.

Figure 7:
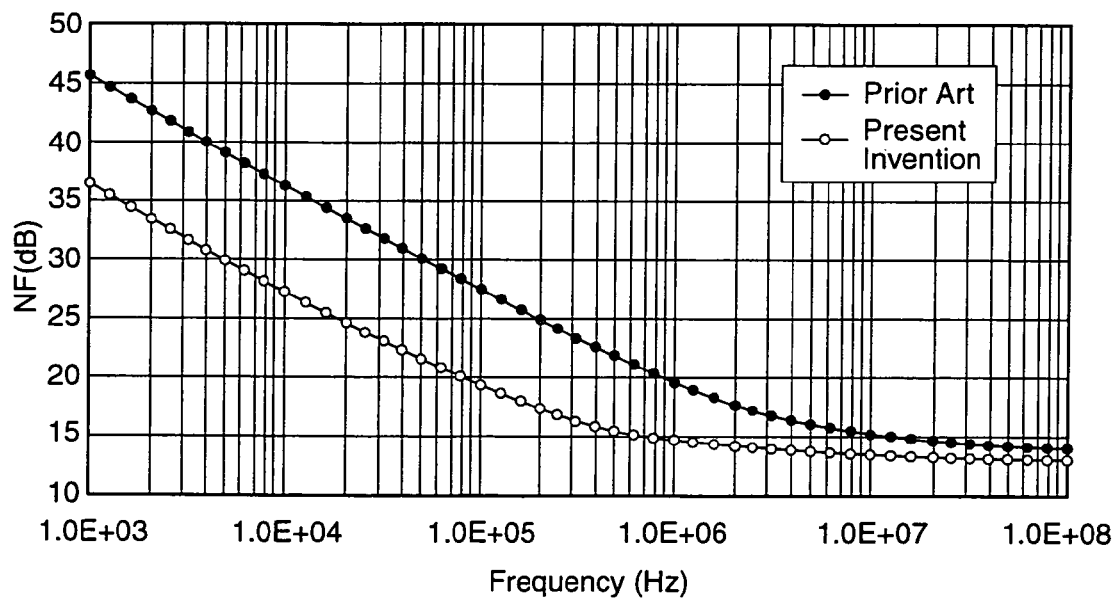
FIG. 7 is a characteristics chart illustrating effects of the mixer circuit according to the third embodiment.

FIG. 7 is an NF characteristics chart for explaining the effects of the mixer circuit according to the third embodiment. This chart shows plotted NF characteristics obtained on the first and second IF output terminals 33 and 34 in a case where a bias current of 2 mA is supplied to the RF transistor 11, LO signals with a frequency of 1 GHz and an amplitude of 1 V are supplied from the LO signal supplier 60, the bypass current source 45 has a current value of Ib=2 mA, and the second and third bypass current sources 46 and 47 have a current value of Ib/2=1 mA. For comparison with the conventional mixer circuit, the NF characteristics when the first bypass current source 45 and the second and third bypass current sources 46 and 47 are not provided is also shown.

In the conventional mixer circuit having no bypass current source, since there are not provided a first bypass current source 45 and a second and third bypass current source 46 and 47, the half of the bias current flowing through the RF transistor 11 is supplied to the first and second LO transistors 21 and 22 as a bias current of the LO transistor, respectively. In contrast, in the mixer circuit of the third embodiment, since the first bypass current source 45 and the second and third bypass current sources 46 and 47 are connected as shown in FIG. 6, it is possible to decrease the bias current flowing through the first and second LO transistors 21 and 22 without decreasing the bias current flowing through the RF transistor 11. That is, it is possible to decrease gmLO without decreasing gmRF of Formula 4, thereby to improve the NF characteristics. For example, it is possible to increase NF at 1 kHz, by about 10 dB, as compared with the conventional mixer circuit, as shown in FIG. 7.

As described above, according to the mixer circuit of the third embodiment, in addition to the first bypass current source 45 provided between the supply voltage VDD and the drain terminal of the RF transistor 11, there are provided the second bypass current source 46 between the first IF output terminal 33 and the ground GND, and the third bypass current source 47 between the second IF output terminal 34 and the ground GND, and thereby, it is possible to decrease the bias current flowing through the first and second LO transistors 21 and 22 without decreasing the bias current source flowing through the RF transistor 11, and thereby to improve the NF characteristics at low frequencies.

While in the third embodiment the basic construction of the mixer core part is a single balanced mixer, the present invention does not limit the basic construction of the mixer core part, and a dual gate mixer or the like may be employed.

Further, while in the third embodiment the single balanced mixer is constituted by MOS transistors, it is not limited to that, and a construction in which bipolar transistors, MESFETs of GaAs, or the like are used may be employed.

Further, while in the third embodiment the current values of the first bypass current source 45, and the second and the third bypass current sources 46, 47 are made respectively Ib=2 mA, and Ib/2=1 mA, these may be any values.

Embodiment 4

Figure 8:
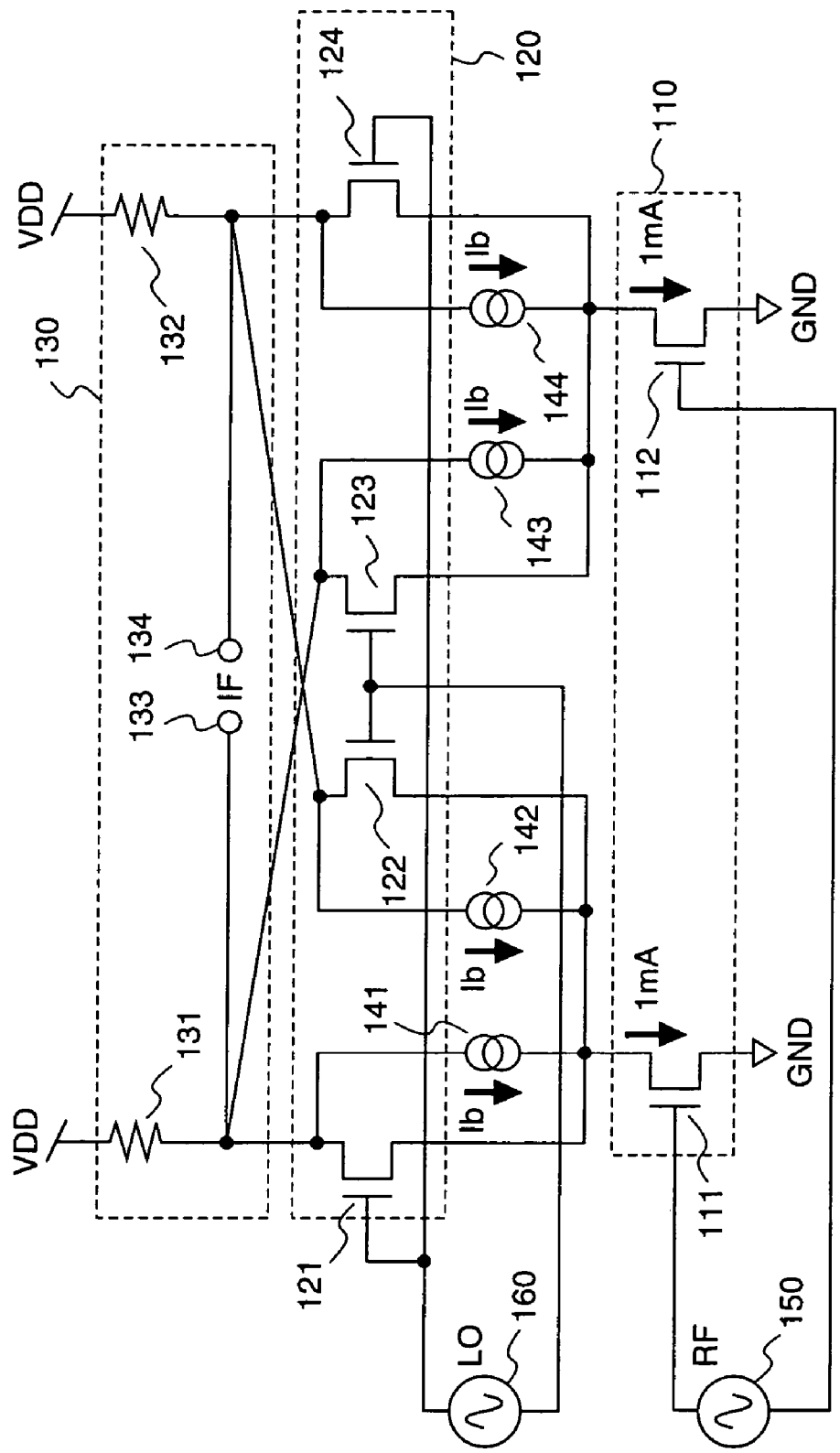
FIG. 8 is a circuit diagram showing a structure of a mixer circuit according to a fourth embodiment of the present invention.

FIG. 8 is a circuit diagram illustrating a construction of a mixer circuit according to a fourth embodiment of the present invention.

As shown in FIG. 8, the mixer circuit according to the fourth embodiment has a basic structure of its mixer core part which is constituted by a double balanced mixer, and includes a double balanced mixer which is obtained by connecting an IF signal output load portion 130, an LO signal processing portion 120, and an RF signal processing portion 110 in cascade connection between the power supply VDD and the ground GND, an RF signal supplier 150 for supplying an RF signal to the RF signal processing portion 110, an LO signal supplier 160 for supplying LO signals to the LO signal processing portion 120, and first to fourth bypass current sources 141 to 144 for bypassing a bias current of the LO signal processing portion 120, which are connected in parallel with the first to fourth LO transistors 121 to 124 of the LO signal processing portion 120, respectively.

The IF signal output load portion 130 includes a first load resistor 131 having an end which is connected to the power supply VDD and another end which is connected to the first IF output terminal 133, and a second load resistor 132 having an end which is connected to the power supply VDD and another end which is connected to the second IF output terminal 134.

The RF signal processing portion 110 comprises first and second RF transistors 111 and 112 having source terminals which are respectively connected to the ground GND.

The LO signal processing portion 120 includes a first LO transistor 121 which has a source terminal connected to the drain terminal of the first RF transistor 111 and a drain terminal connected to the first IF output terminal 133, a second LO transistor 122 which has a source terminal connected to the drain terminal of the first RF transistor 111 and a drain terminal connected to the second IF output terminal 134, a third LO transistor 123 which has a source terminal connected to the drain terminal of the second RF transistor 112 and a drain terminal connected to the first IF output terminal 133, and a fourth LO transistor 124 which has a source terminal connected to the drain terminal of the second RF transistor 112 and a drain terminal connected to the second IF output terminal 134.

The first bypass current source 141 is connected in parallel with the first LO transistor 121 between the first IF output terminal 133 and the drain terminal of the first RF transistor 111, and the second bypass current source 142 is connected in parallel with the second LO transistor 122 between the second IF output terminal 134 and the drain terminal of the first RF transistor 111. The third bypass current source 143 is connected in parallel with the third LO transistor 123 between the first IF output terminal 133 and the drain terminal of the second RF transistor 112, and the fourth bypass current source 144 is connected in parallel with the fourth LO transistor 124 between the second IF output terminal 134 and the drain terminal of the second RF transistor 112. These first to fourth bypass current sources 141 to 144 are covered in a bypass current supply portion described in claim 10.

The first to fourth bypass current sources 141 to 144 may include, for example, the bias circuit 43 and the current source transistor 44, as shown in FIG. 2. Further, a bypass current may be generated by any elements or circuits which realize constant current source characteristics.

The operation of the mixer circuit according to the fourth embodiment in which the basic structure of the mixer core part is constituted by a double balanced mixer as described above, will be described hereinafter.

An RF signal that is supplied from the RF signal supplier 150 is inputted to the first and second RF transistors 111 and 112, and is converted from a voltage signal to a current signal.

On the other hand, one of the differential LO signals which are supplied from the LO signal supplier 160 is inputted to the first and fourth LO transistors 121 and 124, and the other of the differential LO signals is inputted to the second and third LO transistors 122 and 123. Then, the first and fourth LO transistors 121 and 124, and the second and third LO transistors 122 and 123 repeatedly perform switching operation at the frequency of the LO signal.

When the RF signal which has been converted into the current signal is inputted to the first and fourth LO transistors 121 and 124 and the second and third LO transistors 122 and 123 performing the switching operation, respectively, the RF signal and the LO signal are multiplied. Thereby, the RF signal is subjected to frequency conversion to be an IF signal, and the IF signal is subjected to voltage conversion by the first and second load resistors 131 and 132, thereby obtaining voltage IF signals through the first and second IF output terminals 133 and 134.

At this time, the bypass current source 141 decreases a bias current flowing through the first LO transistor 121, thereby to suppress flicker noises occurring from the first LO transistor 121. Similarly, the second to fourth bypass current sources 142 to 144 decreases bias currents flowing through the second to fourth LO transistors 122 to 124, thereby suppressing flicker noises occurring from the second to fourth LO transistors 122 to 124.

Next, the effects of suppressing flicker noises by the mixer circuit according to the fourth embodiment will be described, compared with the conventional mixer circuit.

Figure 9:
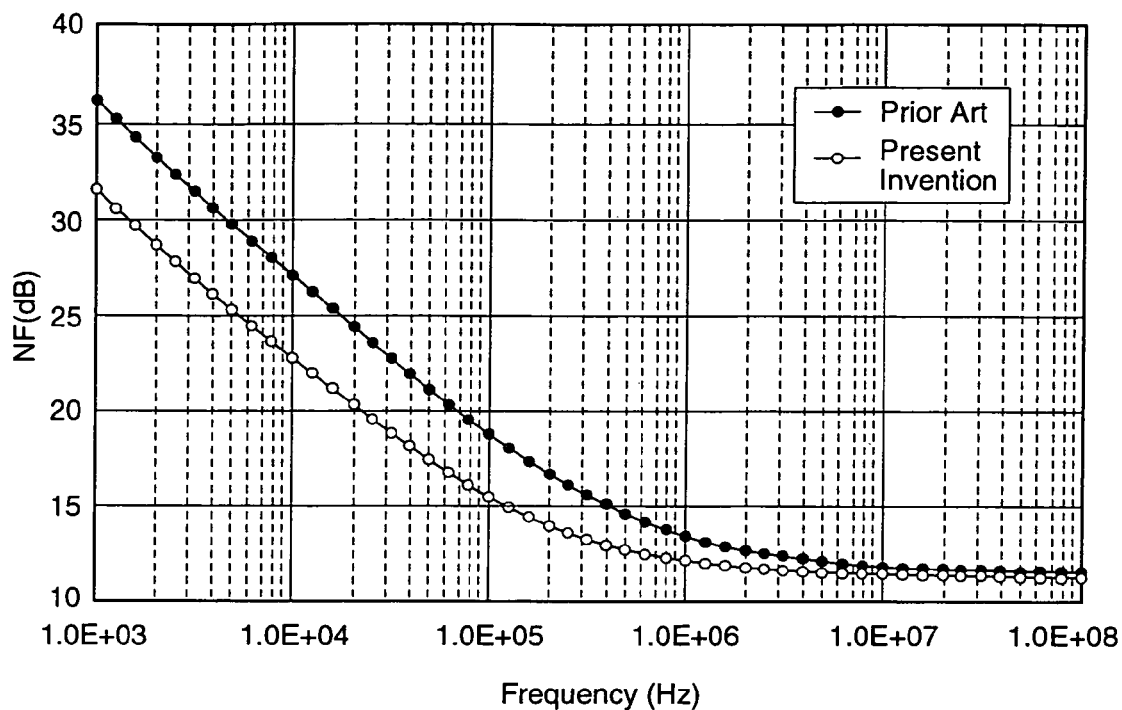
FIG. 9 is a characteristics chart illustrating effects of the mixer circuit according to the fourth embodiment.

FIG. 9 is an NF characteristics chart for explaining the effects of the mixer circuit according to the fourth embodiment. This chart shows plotted NF characteristics on the first and second IF output terminals 133 and 134 in a case where a bias current of 1 mA is supplied to the first and second RF transistors 111 and 112, LO signals with a frequency of 1 GHz and an amplitude of 1V are supplied from the LO signal supplier 160, and the first to fourth bypass current sources 141 to 144 have a current value of Ib=1/2 mA, respectively. For the comparison with the conventional mixer circuit, the NF characteristics of a case where the first to fourth bypass current sources 141 to 144 are not provided is also shown.

In the conventional mixer which includes no bypass current source, the half of the bias current flowing through the RF transistor is supplied to the respective LO transistors as their bias currents. In contrast, in the mixer circuit of the fourth embodiment, the first to fourth bypass current sources 141 to 144 are connected to the first to fourth LO transistors 121 to 124, respectively, as shown in FIG. 8, and thereby, it is possible to decrease the bias current flowing through the first to fourth LO transistors 121 to 124 without decreasing the bias current flowing through the first and second RF transistors 111 and 112. That is, it is possible to decrease gmLO without decreasing gmRF of Formula 4, thereby to improve the NF characteristics. For example, it is possible to increase NF at 1 kHz, by about 5 dB, as compared with the conventional mixer circuit, as shown in FIG. 9.

As described above, in the mixer circuit according to the fourth embodiment, since the first bypass current source 141 is connected in parallel with the first LO transistor 121, and the second bypass current source 142 is connected in parallel with the second LO transistor 122, the third bypass current source 143 is connected in parallel with the third LO transistor 123, and the fourth bypass current source 144 is connected in parallel with the fourth LO transistor 124, it is possible to decrease the bias current flowing through the first to fourth LO transistors 121 to 124 without decreasing the bias current flowing through the first and second RF transistors 111 and 112, and to improve the NF characteristics at low frequencies.

Figure 10:
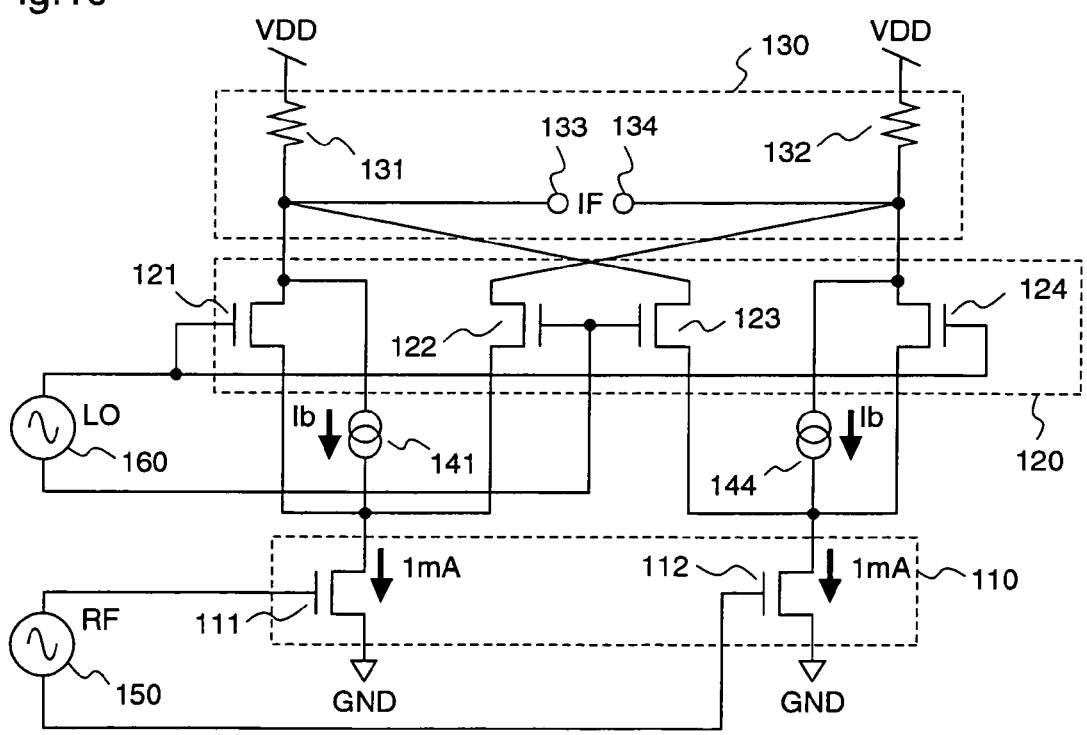
FIG. 10 is a circuit diagram showing another structure of the mixer circuit according to the fourth embodiment.
Figure 11:
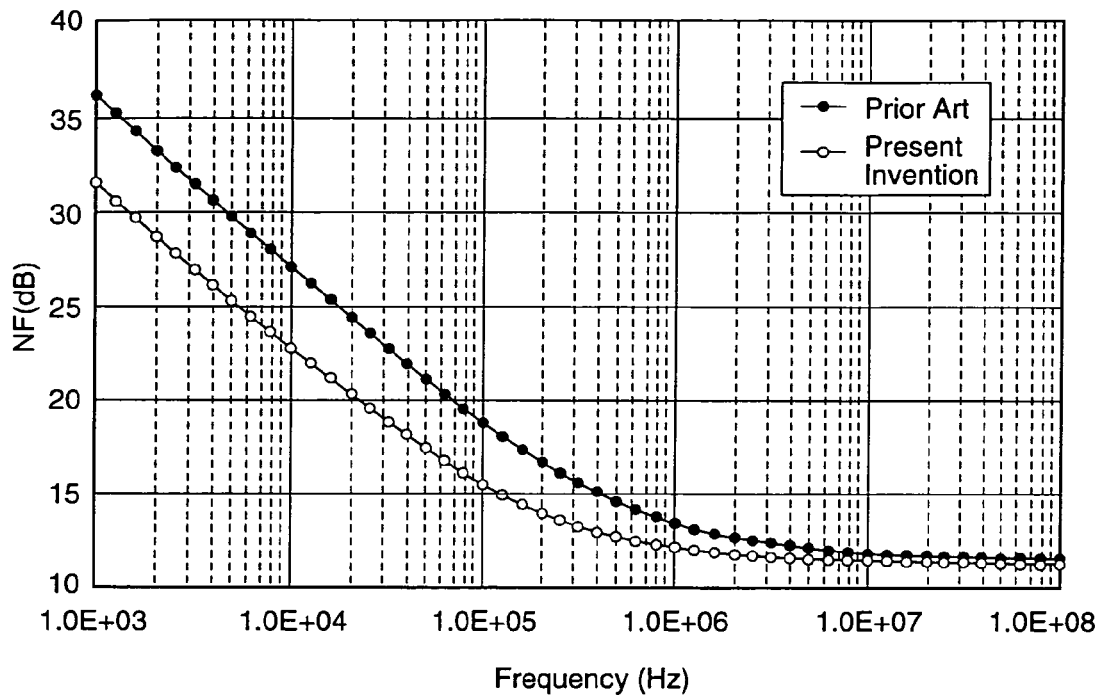
FIG. 11 is an another characteristics chart illustrating effects of the mixer circuit according to the fourth embodiment.

While in the fourth embodiment, the first to fourth bypass current sources 141 to 144 are connected in parallel with the first to fourth LO transistors 121 to 124, the bypass current sources may be connected in parallel with the first and fourth LO transistors 121 and 124. That is, also in case where the first bypass current source 141 is connected in parallel with the first LO transistor 121 between the first IF output terminal 133 and the drain terminal of the first RF transistor 111, and the fourth bypass current source 144 is connected in parallel with the fourth LO transistor 124 between the second IF output terminal 134 and the drain terminal of the second RF transistor 112 as shown in FIG. 10, it is possible to decrease the bias current flowing through the first to fourth LO transistors 121 to 124 without decreasing the bias current flowing through the first and second RF transistors 111 and 112, thereby to improve the NF characteristics at low frequencies. For example, when a bias current of 1 mA is supplied to the first and second RF transistors 111 and 112, LO signals with the frequency of 1 GHz and an amplitude of 1V are supplied from the LO signal supplier 160, and the currents of the first and fourth bypass current sources 141 and 144 are made Ib=1 mA, it is possible to increase NF on the first and second IF output terminals 133 and 134 at 1 kHz, by about 5 dB, as compared with the conventional mixer, as shown in FIG. 11.

While in the fourth embodiment the basic structure of the mixer core part is a double balanced mixer, the present invention does not limit the basic construction of the mixer core part, and a dual gate mixer or the like may be employed.

Further, while in the fourth embodiment the double balanced mixer is constituted by MOS transistors, it is not limited to that, and a construction in which in which bipolar transistors, MESFETs of GaAs, or the like, are used may be employed.

Embodiment 5

Figure 12:
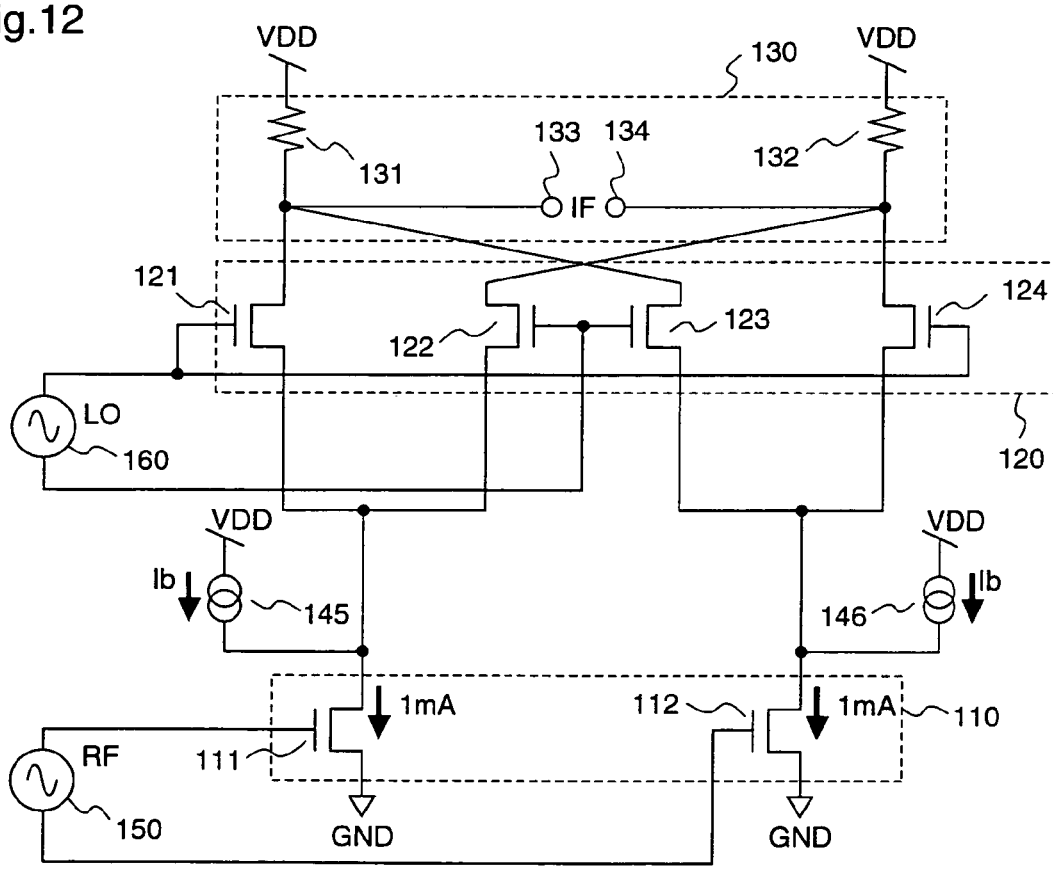
FIG. 12 is a circuit diagram showing a structure of a mixer circuit according to a fifth embodiment of the present invention.

FIG. 12 is a circuit diagram illustrating a structure of a mixer circuit according to a fifth embodiment of the present invention. In FIG. 12, the same or corresponding parts as in FIG. 8 are denoted by the same reference numerals, and their detailed descriptions are omitted.

As shown in FIG. 12, in the mixer circuit according to the fifth embodiment, a first bypass current source 145 is connected between the power supply VDD the drain terminal of the first RF transistor 111, and a second bypass current source 146 is connected between the supply voltage VDD and the drain terminal of the second RF transistor 112, so as to additionally supply bias currents only to the first and second RF transistors 111 and 112. These first and bypass current sources 145 and 146 are covered in a bypass current supply portion described in claim 12.

The first and second bypass current sources 145 and 146 may be, for example, one which includes the bias circuit 43 and the current source transistor 44, as shown in FIG. 2. Further, it may generate bypass currents by any elements or circuits which realize constant current source characteristics.

The operation of the mixer circuit according to the fifth embodiment in which the basic construction of the mixer core part is constituted by a double balanced mixer as described above, will be described hereinafter.

Differential RF signals which are supplied from the RF signal supplier 150 are inputted to the first and second RF transistors 111 and 112, respectively, and are converted from voltage signals into current signals.

On the other hand, one of the differential LO signals which are supplied from the LO signal supplier 160 is inputted to the first and fourth LO transistors 121 and 124, and the other of the differential LO signals is inputted to the second and third LO transistors 122 and 123. Then, the first and fourth LO transistors 121 and 124 and the second and third LO transistors 122 and 123 repeatedly perform switching operations at the frequency of the LO signal.

When the RF signal that has been converted into the current signal is inputted to the first and fourth LO transistors 121 and 124 and the second and third LO transistors performing the switching operations, the RF signal and the LO signal are multiplied. Thereby, the RF signal is subjected to frequency conversion to be an IF signal, and the IF signal is subjected to voltage conversion by the first and second load resistors 131 and 132, thereby outputting voltage IF signals through the first and second IF output terminals 133 and 134.

At this time, the first bypass current source 145 decreases the bias current flowing through the first and second LO transistors 121 and 122, thereby suppressing flicker noises occurring from the first and second LO transistors 121 and 122. Similarly, the second bypass current source 146 decreases the bias current flowing through the third and fourth LO transistors 123 and 124, thereby suppressing flicker noises occurring from the third and fourth LO transistors 123 and 124.

Next, the effects of suppressing flicker noises by the mixer circuit according to the fifth embodiment will be described, compared with the conventional mixer.

Figure 13:
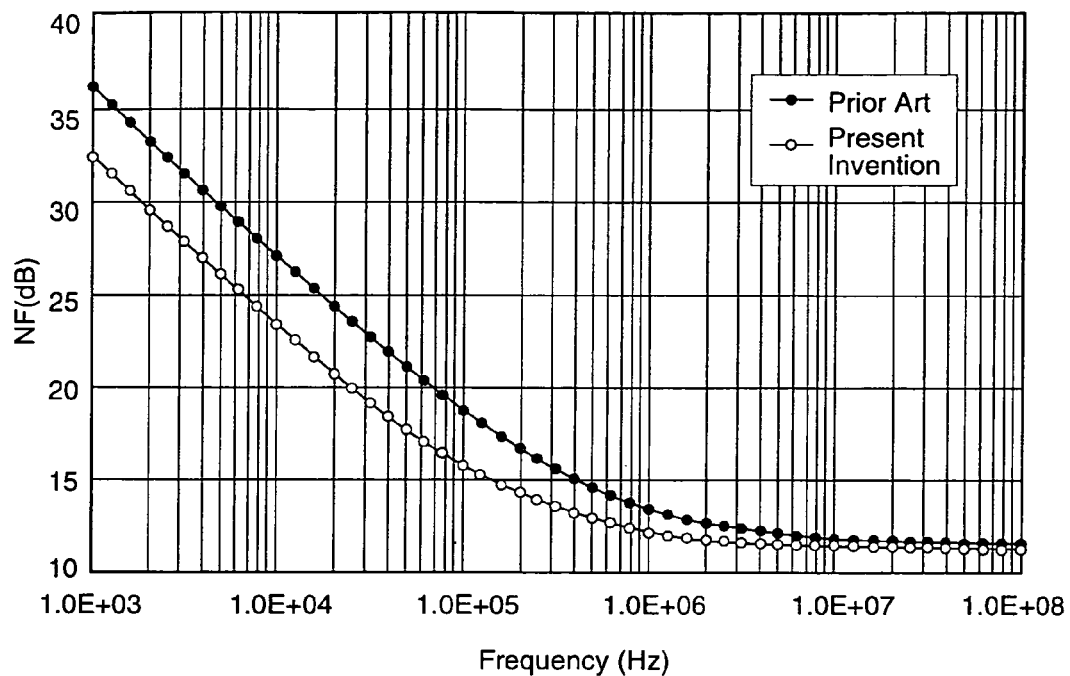
FIG. 13 is a characteristics chart illustrating effects of the mixer circuit according to the fifth embodiment.

FIG. 13 is an NF characteristics chart for explaining the effects of the mixer circuit according to the fifth embodiment. This chart shows plotted NF characteristics on the first and second IF output terminals 133 and 134 in a case where a bias current of 1 mA is supplied to the first and second RF transistors 111 and 112, LO signals with a frequency of 1 GHz and an amplitude of 1V are supplied from the LO signal supplier 160, and the first and second bypass current sources 145 and 146 have a current value of Ib=1 mA, respectively. For comparison with the conventional mixer circuit, the NF characteristics of a case where the first and second bypass current sources 145 and 146 are not provided is also shown.

In the conventional mixer circuit which includes no bypass current source, the half of the bypass current flowing through the RF transistor is supplied to the respective LO transistors as the bias currents. In contrast, in the mixer circuit according to the fifth embodiment, the first and second bypass current sources 145 and 146 are connected between the supply voltage VDD and the first and second RF transistors 111 and 112, respectively, as shown in FIG. 12, and thereby, it is possible to decrease the bias current flowing through the first to fourth LO transistors 121 to 124 without decreasing the bias current flowing through the first and second RF transistors 111 and 112. That is, it is possible to decrease gmLO without decreasing gmRF of Formula 4, thereby to improve the NF characteristics. For example, as shown in FIG. 13, it is possible to increase the NF at 1 kHz, by about 4 dB, as compared to the conventional mixer circuit.

As described above, in the mixer circuit according to the fifth embodiment, since the first bypass current source 145 is connected between the power supply VDD and the drain terminal of the first RF transistor 111, and the second bypass current source 146 is connected between the power supply VDD and the drain terminal of the second RF transistor 112 so as to additionally supply the bias currents only to the first and second RF transistors 111 and 112, it is possible to decrease the bias currents flowing through the first to fourth LO transistors 121 to 124 without decreasing the bias current flowing through the first and second RF transistors 111 and 112, and thereby to improve the NF characteristics at low frequencies.

While in the fifth embodiment the basic construction of the mixer core part is a double balanced mixer, the present invention does not limit the basic construction of the mixer core part, and a dual gate mixer or the like may employed.

Further, while in the fifth embodiment the single balanced mixer is constituted by MOS transistors, it is not limited to that, and a construction in which bipolar transistors, MESFETs of GaAs, or the like are used may be employed.

Embodiment 6

Figure 14:
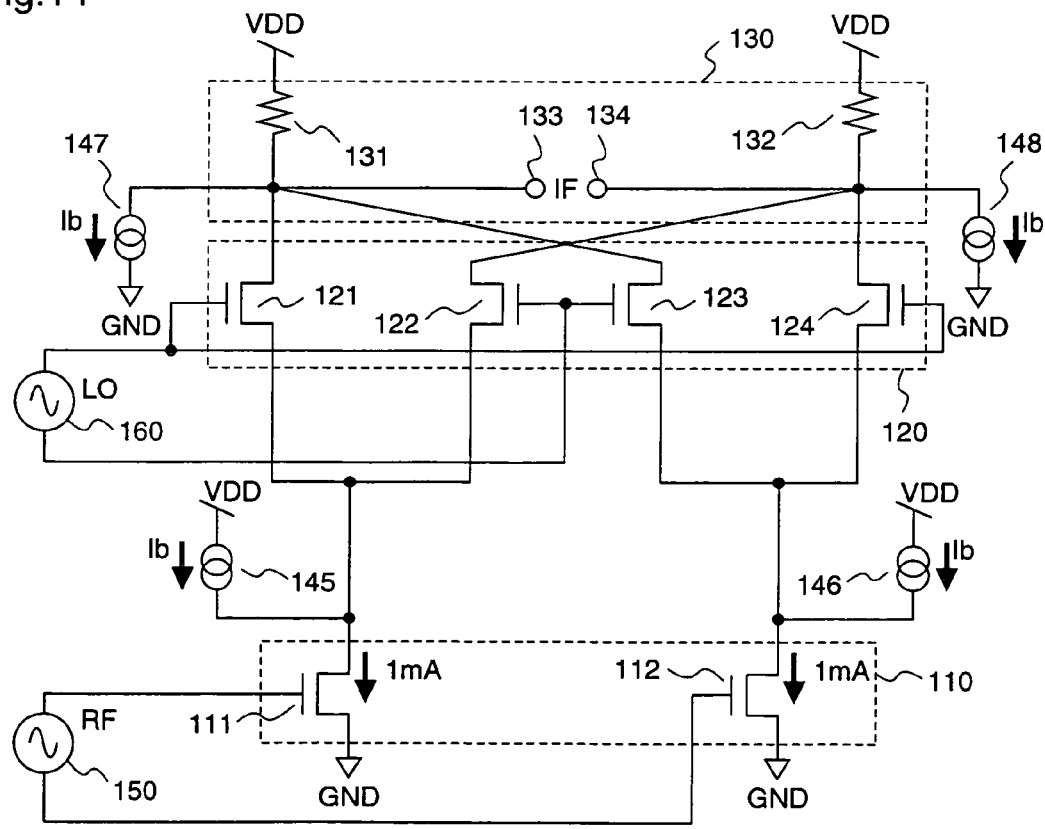
FIG. 14 is a circuit diagram showing a structure of a mixer circuit according to a sixth embodiment of the present invention.

FIG. 14 is a circuit diagram illustrating a structure of a mixer circuit according to a sixth embodiment of the present invention. In FIG. 14, the same ore corresponding parts as in FIG. 12 are denoted by the same reference numerals, and their detailed descriptions are omitted.

As shown in FIG. 14, the mixer circuit according to the sixth embodiment includes, in addition to that the fifth embodiment of the resent invention is provided with the first and second bypass current sources 145 and 146 that additionally supply the bias currents only to the first and second RF transistors 111 and 112, further a third bypass current source 147 that is connected between the first IF output terminal 133 and the ground GND thereby to additionally supply a bias current only to the first load resistor 131, and a fourth bypass current source 148 which is connected between the second IF output terminal 134 and the ground GND thereby to additionally supply a bias current only to the second load resistor 132. These first to fourth bypass current sources 145 to 148 are covered in a bypass current supply portion described in claim 13.

The third and fourth bypass current sources 147 and 148 may be, for example, those which the bias circuit 43 and the current source transistor 44, as shown in FIG. 2. Further, bypass currents may be generated by any elements or circuits which realize constant current source characteristics.

The operation of the mixer circuit according to the sixth embodiment in which the basic construction of the mixer core part is constituted by a double balanced mixer as described above, will be described hereinafter.

Differential RF signals that are supplied from the RF signal supplier 150 are inputted to the first and second RF transistors 111 and 112, respectively, and are converted from a voltage signal into a current signal.

On the other hand, one of the differential LO signals that are supplied from the LO signal supplier 160 is inputted to the first and fourth LO transistors 121 and 124, and the other of the differential LO signals is inputted to the second and third LO transistors 122 and 123, respectively. Then, the first and fourth LO transistors 121 and 124 and the second and third LO transistors 122 and 123 repeatedly perform switching operations at the frequency of the LO signal.

When the RF signal that has been converted into the current signal is input to the first and fourth LO transistors 121 and 124 and the second and third LO transistors 122 and 123 performing the switching operation, the RF signal and the LO signal are multiplied. Thus, the RF signal is subjected to frequency conversion to be an IF signal, and this IF signal is subjected to voltage conversion by the first and second load resistors 131 and 132, thereby outputting voltage IF signals through the first and second IF output terminals 133 and 134.

At this time, the first bypass current source 145 and the third bypass current source 147 decrease the bias current flowing through the first and second LO transistors 121 and 122, and suppress flicker noises occurring from the first and second LO transistors 121 and 122. Similarly, the second bypass current source 146 and the fourth bypass current source 148 decrease the bias current flowing through the third and fourth LO transistors 123 and 124, and suppress flicker noises occurring from the third and fourth LO transistors 123 and 124.

Next, the effects of suppressing flicker noises by the mixer circuit according to the sixth embodiment will be described, compared with the conventional mixer circuit.

Figure 15:
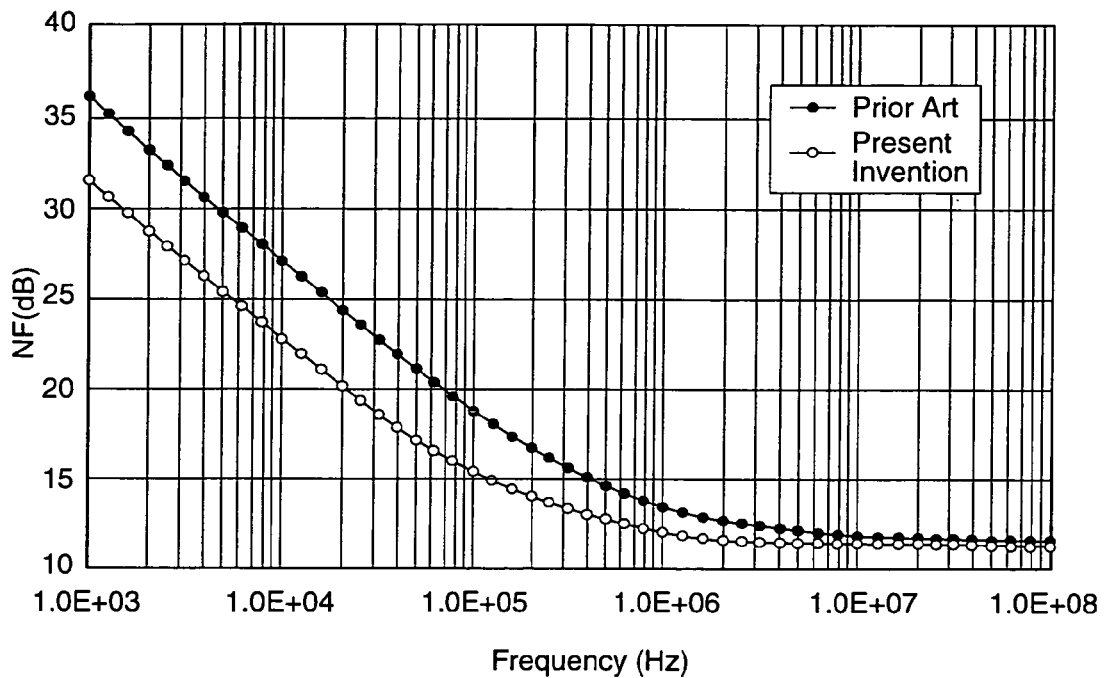
FIG. 15 is a characteristics chart illustrating effects of the mixer circuit according to the sixth embodiment.
Figure 16:
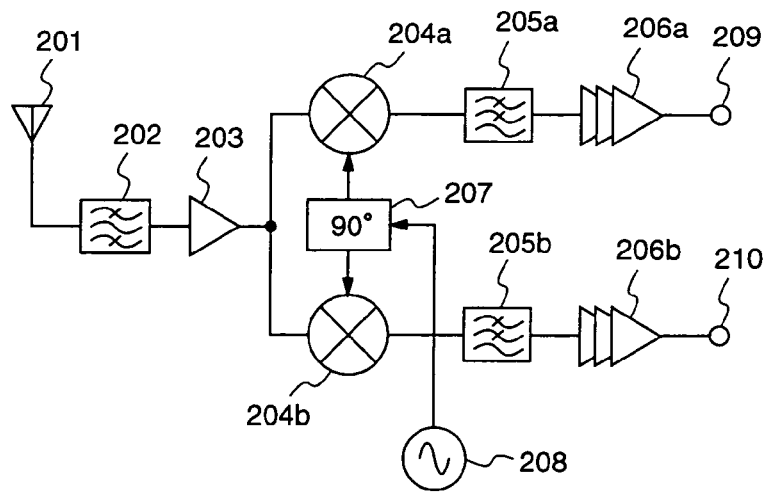
FIG. 16 is a block diagram illustrating a structure of a common direct conversion receiver.
Figure 17:
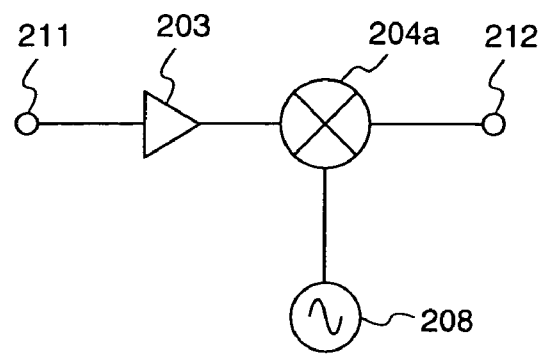
FIG. 17 is a block diagram for explaining influences of low frequency noises of a mixer.
Figure 18:
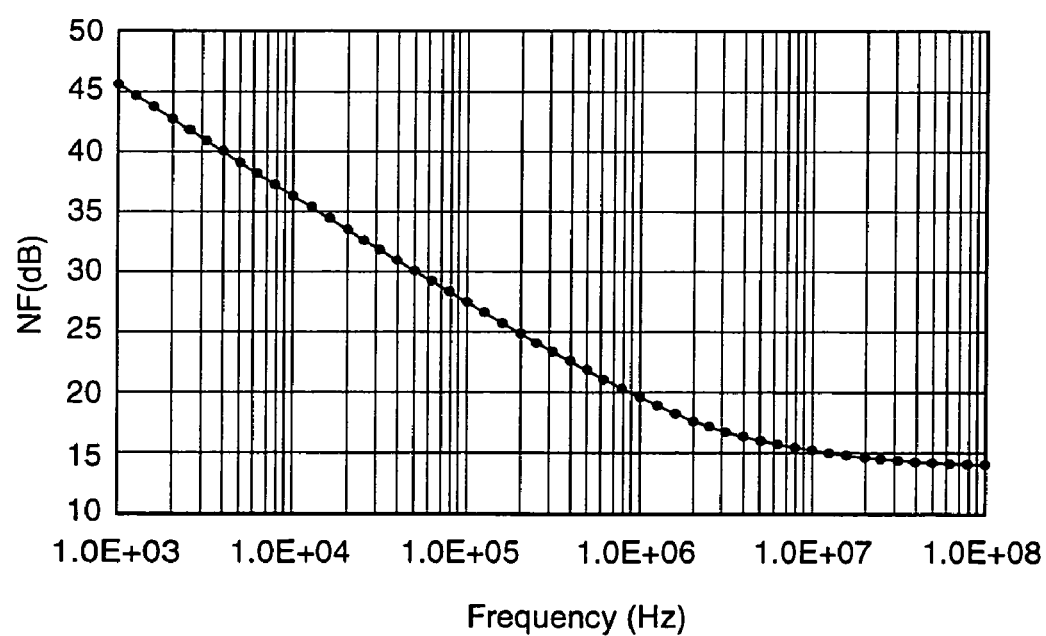
FIG. 18 is a diagram showing the NF characteristics chart of a mixer for explaining the effects of the low frequency noises of the mixer.
Figure 19:
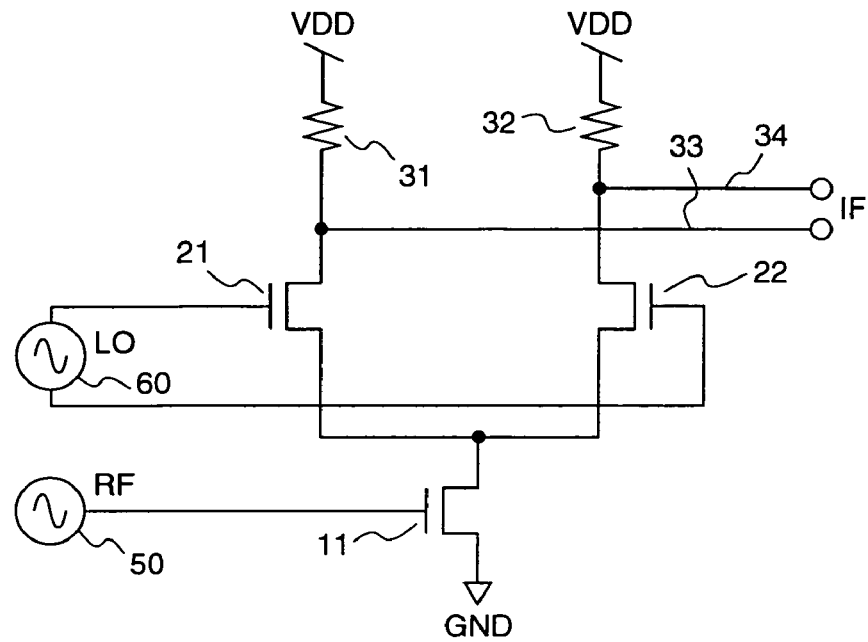
FIG. 19 is a circuit diagram showing a structure of a conventional mixer circuit.
Figure 20:
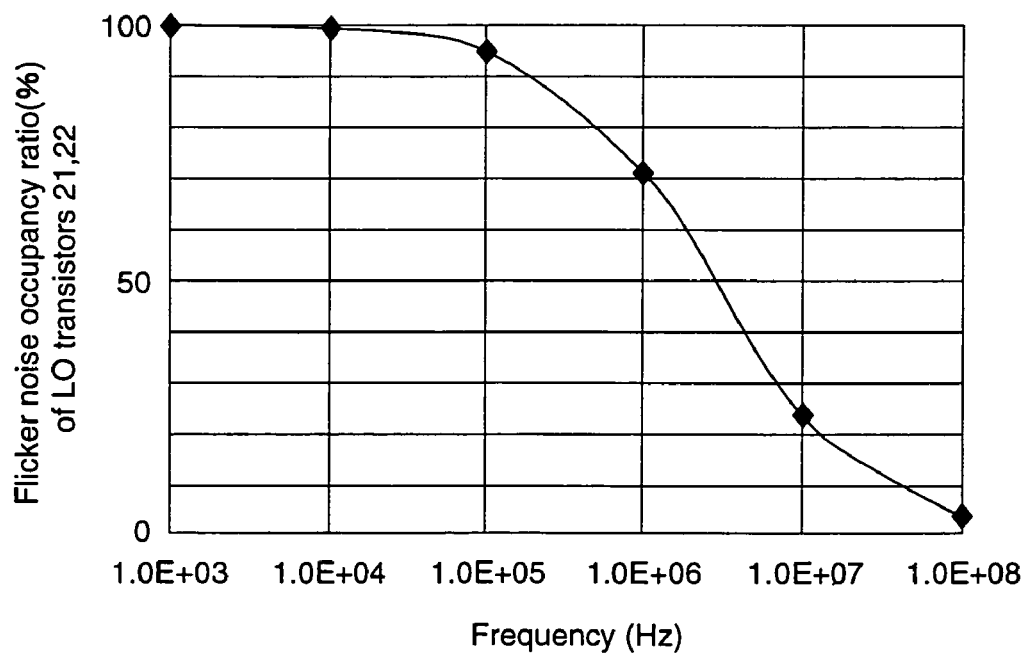
FIG. 20 is a characteristics chart showing a flicker noise occupancy ratio of a LO transistor in the conventional mixer circuit.

FIG. 15 is an NF characteristics chart for explaining the effects of the mixer circuit according to the sixth embodiment. This chart shows plotted NF characteristics obtained on the first and second IF output terminals 133 and 134 in a case where a bias current of 1 mA is supplied to the first and second RF transistors 111 and 112, LO signals with a frequency of 1 GHz and an amplitude of 1V are supplied from the LO signal supplier 160, and the first and second bypass current sources 145 and 146 and the third and fourth bypass current source 147 and 148 have a current value of Ib=1 mA, respectively. For comparison with the conventional mixer circuit, the NF characteristics of a case where the first and second bypass current sources 145 and 146 and the third and fourth bypass current source 147 and 148 are not provided is also shown.

In the conventional mixer circuit with no bypass current source, since there are not provided a first and a second bypass current sources and a third and a fourth bypass current sources, the half of the bias current flowing through the RF transistors is supplied to the respective LO transistors as their bias currents. In contrast, in the mixer circuit of the sixth embodiment, since the first and second bypass current sources 145 and 146 and the third and fourth bypass current sources 147 and 148 are connected as shown in FIG. 14, it is possible to decrease the bias current flowing through the first to fourth LO transistors 121 to 124 without decreasing the bias current flowing through the first and second RF transistors 111 and 112. That is, it is possible to decrease gmLO without decreasing gmFR of Formula 4, thereby to improve the NF characteristics. For example, it is possible to increase NF at 1 kHz, by about 5 dB, as compared to the conventional mixer circuit, as shown in FIG. 15.

As described above, according to the mixer circuit of the sixth embodiment, in addition to the first and second bypass current sources 145 and 146 provided between the power supply VDD and the drain terminal of the first and second RF transistors 111 and 112, there are provided the third bypass current source 147 between the first IF output terminal 133 and the ground GND, and the fourth bypass current source 148 between the second IF output terminal 134 and the ground GND, and thereby, it is possible to decrease the bias currents flowing through the first to fourth LO transistors 121 to 124 without decreasing the bias current flowing through the first and second RF transistors 111 and 112, and thereby to improve the NF characteristics at low frequencies.

While in this sixth embodiment the basic construction of the mixer core part is a double balanced mixer, the present invention does not limit the basic construction of the mixer core part, and a dual gate mixer or the like may employed.

Further, while in the sixth embodiment the double balanced mixer is constituted by MOS transistors, it is not limited to that, and a construction in which bipolar transistors, MESFETs of GaAs, or the like are used may be employed.

Further, while in the sixth embodiment the current value of the first and second bypass current source 145 and 146, and the current value of the third and fourth bypass current sources 147 and 148 are made Ib=1 mA, respectively, these may be any values.

INDUSTRIAL AVAILABILITY

The mixer circuit according to the present invention has excellent low frequency noise characteristics, and is useful as a down convert mixer in a radio communication system employing a direct conversion system, a Low IF system, and the like.

The invention claimed is:

1. A mixer circuit, comprising:
a mixer including an IF signal output load portion, an LO signal processing portion, and an RF signal processing portion, which are connected in cascade connection between a power supply and a ground;
an RF signal supplier for supplying an RF signal to the RF signal processing portion;
an LO signal supplier for supplying an LO signal to the LO signal processing portion; and
at least one bypass current supply portion for bypassing a bias current of the LO signal processing portion, the at least one bypassing current supply portion including a bypass current source,
wherein the bypass current supply portion additionally supplies a bias current only to the RF signal processing portion.

2. The mixer circuit as defined in claim 1, wherein the mixer is constituted by MOS transistors.

3. A mixer circuit comprising:
a single balanced mixer including an IF signal output load portion, an LO signal processing portion, and an RF signal processing portion, which are connected in cascade connection between a supply voltage and a ground;
an RF signal supplier for supplying an RF signal to the RF signal processing portion;
an LO signal supplier for supplying an LO signal to the LO signal processing portion;
at least one bypass current supply portion for bypassing a bias current of the LO signal processing portion, the at least one bypass current supply portion including a bypass current source, wherein the bypass current supply portion includes a first bypass current source for additionally supplying a bias current only to an RF transistor, which is connected between the power supply and a drain terminal of the RF transistor;
said IF signal output load portion including a first load resistor having an end connected to the power supply and another end connected to a first IF output terminal, and a second load resistor having an end connected to the power supply and another end connected to a second IF output terminal;
the RF signal processing portion including an RF transistor having a source terminal connected to the ground;
said LO signal processing portion including a first LO transistor having a source terminal connected to a drain terminal of the RF transistor and a drain terminal connected to the first IF output terminal, and a second LO transistor having a source terminal connected to the drain terminal of the RF transistor and a drain terminal connected to the second IF output terminal.

4. The mixer circuit as defined in claim 3, wherein the single balanced mixer is constituted by MOS transistors.

* * * * *

UNITED STATES PATENT AND TRADEMARK OFFICE
CERTIFICATE OF CORRECTION

PATENT NO. : 7,613,440 B2
APPLICATION NO. : 10/581038
DATED : November 3, 2009
INVENTOR(S) : Hijikata et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 605 days.

Signed and Sealed this

Nineteenth Day of October, 2010

David J. Kappos
*Director of the United States Patent and Trademark Office*